United States Patent
Mori et al.

(10) Patent No.: US 7,040,852 B2
(45) Date of Patent: May 9, 2006

(54) ROBOT ARM MECHANISM AND ROBOT APPARATUS

(75) Inventors: Hiroki Mori, Tsu (JP); Tetsuya Watanabe, Tsu (JP); Chohei Okuno, Ise (JP)

(73) Assignee: Teijin Seiki Co., Ltd., Tokyo (JP)

( * ) Notice: Subject to any disclaimer, the term of this patent is extended or adjusted under 35 U.S.C. 154(b) by 166 days.

(21) Appl. No.: 10/421,834

(22) Filed: Apr. 24, 2003

(65) Prior Publication Data
US 2003/0202872 A1 Oct. 30, 2003

(30) Foreign Application Priority Data
Apr. 25, 2002 (JP) .............................. 2002-124850

(51) Int. Cl.
*B25J 18/00* (2006.01)

(52) U.S. Cl. .............................. 414/744.5; 74/490.05; 414/917; 901/28

(58) Field of Classification Search ............. 414/744.5, 414/917; 901/15, 16, 23, 27, 28; 74/490.01, 74/490.03, 490.05
See application file for complete search history.

(56) References Cited

U.S. PATENT DOCUMENTS 6,158,941 A 12/2000 Muka
6,705,177 B1 * 3/2004 Okuno et al. ............ 74/490.01

FOREIGN PATENT DOCUMENTS

EP 1248318 10/2002
JP 10-277973 10/1998

* cited by examiner

*Primary Examiner*—Donald W. Underwood
(74) *Attorney, Agent, or Firm*—Venable LLP; Andrew C. Aitken

(57) ABSTRACT

Herein disclosed is a robot arm mechanism comprising: a first handling member for supporting and handling a first object; a second handling member for supporting and handling a second object; a first robot arm including a first arm link and a second arm link, the first end portion of the second arm link being pivotably connected to the second end portion of the first arm link, and the second end portion of the second arm link being connected to the first handling member to allow the first handling member to support the first object in a stable condition; a second robot arm including a first arm link and a second arm link, the first end portion of the second arm link being pivotably connected to the second end portion of the first arm link, the second arm link being inclined with respect to the second arm link of the first robot arm at a preset angle defined between the central line of the second arm link of the second robot arm and the central line of the second arm link of the first robot arm, and the second end portion of the second arm link being connected to the second handling member to allow the second handling member to support the second object in a stable condition; a robot arm moving mechanism for allowing one of the first arm links of and of the first and second robot arms to be angularly moved with respect to the other of the first arm links of the first and second robot arms; and an angle keeping mechanism for keeping substantially fixed the preset angle defined between the central line of the second arm link of the second robot arm and the central line of the second arm link of the first robot arm as one of the first arm links of the first and second robot arms is angularly moved with respect to the other of the first arm links of the first and second robot arms.

21 Claims, 14 Drawing Sheets

200

ROBOT ARM MECHANISM AND ROBOT APPARATUS

BACKGROUND OF THE INVENTION

1. Field of the Invention

The present invention relates to a robot arm mechanism having arms contracted and extended, and more particularly to a robot arm mechanism incorporating an arm driving mechanism for driving the arms to assume its contracted and extended positions.

2. Description of the Related Art

Up until now, there have been proposed a wide variety of conventional robot arm mechanisms available in the process of producing semiconductors in which the robot arm mechanism is operated to have robot arms contracted and extended to handle works, i.e., objects to be treated. These objects may include works such as, for example, wafers and other precision parts that are to be transferred and then unloaded onto a work table by the robot arm mechanism.

One typical example of the conventional robot arm mechanism of this type is disclosed in, for example, Japanese Patent Laying-Open Publication No. 2002-222488 and shown in FIG. 16. The conventional robot arm mechanism 910 is shown in FIG. 16 as comprising a first handling member 951, a second handling member 952, a first robot arm 910a, and a second robot arm 910b.

The first handling member 951 is operative to support and handle a first object, while the second handling member 952 is operative to support and handle a second object. The first robot arm 910a includes a first arm link 931 having a first end portion, a second end portion, a longitudinally intermediate portion intervening between the first end portion and the second end portion, and a central line passing through the first end portion and the second end portion, and a second arm link 941 having a first end portion, a second end portion, a longitudinally intermediate portion intervening between the first end portion and the second end portion, and a central line passing through the first end portion and the second end portion.

The second end portion of the first arm link 931 is pivotably connected to the first end portion of the second arm link 941, while the second end portion of the second arm link 941 is connected to the first handling member 951 to allow the first handling member 951 to support the first object in a stable condition.

The second robot arm 910b includes a first arm link 932 having a first end portion, a second end portion, a longitudinally intermediate portion intervening between the first end portion and the second end portion, and a central line passing through the first end portion and the second end portion, and a second arm link 942 having a first end portion, a second end portion, a longitudinally intermediate portion intervening between the first end portion and the second end portion, and a central line passing through the first end portion and the second end portion.

The first arm link 941 is inclined with respect to the second arm link 942 at a preset angle defined between the central line of the second arm link 941 of the first robot arm 910a and the central line of the second arm link 942 of the second robot arm 910b. The second end portion of the first arm link 932 is pivotably connected to the first end portion of the second arm link 942, while the second end portion of the second arm link 942 is connected to the first handling member 952 to allow the first handling member 952 to support the first object in a stable condition. The conventional robot arm mechanism 910 further comprises an angle keeping mechanism 960 for keeping substantially fixed the preset angle defined between the central line of the second arm link 941 of the first robot arm 910a and the central line of the second arm link 942 of the second robot arm 910b.

The angle keeping mechanism 960 includes a first link 961, a second link 962, a third link 963, a fourth link 964, a fifth link 965, and a sixth link 966. The first link 961 has a first end portion and a second end portion. The second link 962 has a first end portion, a second end portion, and a central line passing through the first end portion and the second end portion. The first end portion of the second link 962 is pivotably connected to the longitudinally intermediate portion of the second arm link 941 of the first robot arm 910a. The second end portion of the second link 962 is pivotably connected to the first end portion of the first link 961 under the state that the central line of the second link 962 is in parallel relationship with the central line of the first arm link 931 of the first robot arm 910a.

The third link 963 has a first end portion, a second end portion, and a central line passing through the first end portion, the second end portion, and a longitudinally intermediate portion intervening between the first end portion and the second end portion. The first end portion of the third link 963 is pivotably connected to the longitudinally intermediate portion of the second arm link 942 of the first robot arm 910b, while the second end portion of the third link 963 is pivotably connected to the second end portion of the first link 961 of under the state that the central line of the third link 963 is in parallel relationship with the central line of the first arm link 932 of the second robot arm 910b. The fourth link 964 has a first end portion and a second end portion. The first end portion of the fourth link 964 is pivotably connected to the longitudinally intermediate portion of the first arm link 931 of the first robot arm 910a.

The fifth link 965 has a first end portion and a second end portion. The first end portion of the fifth link 965 is pivotally connected to the second end portion of the fourth link 964, while the second end portion of the fifth link 965 is pivotably connected to the longitudinally intermediate portion of the first arm link 932 of the first robot arm 910b. The sixth link 966 has a first end portion and a second end portion. The first end portion of the sixth link 966 is pivotably connected to the longitudinally intermediate portion of first arm link 932 of the second robot arm 910b, while the second end portion of the sixth link 966 is pivotably connected to the longitudinally intermediate portion of third link 963. The sixth link 966 is integrally formed with the fifth link 965 under the state that the first end portion of the sixth link 966 is connected to the second end portion of the fifth link 965. The central line of the sixth link 966 is substantially in parallel relationship with the central line of the second arm link 942 of the second robot arm 910b.

The angle keeping mechanism 960 further includes a first driving shaft 921 connected to the first arm link 931 of the first robot arm 910a, and a second driving shaft 922 connected to the second arm link 932 of the second robot arm 910b; and a connecting shaft 923 connected to third link 961.

The conventional robot apparatus 900 comprises the conventional robot arm mechanism 910 as previously mentioned, and first and second driving motors not shown in FIG. 16. The first driving motor is operative to drive the first driving shaft 921 to have the first driving shaft 921 pivoted clockwise and counterclockwise around the pivotal axis within a pivotal movement range. The second driving motor is operative to drive the second driving shaft 922 to have the second driving shaft 922 pivoted clockwise and counterclockwise around the pivotal axis within the pivotal movement range.

The angle keeping mechanism 960 is operative to keep substantially fixed the preset angle defined between the central line of the second arm link 941 of the first robot arm 910a and the central line of the second arm link 942 of the second robot arm 910b while the first and second driving shafts 921 and 922 are respectively pivoted clockwise and counterclockwise around the pivotal axis by the first and second driving motors to have one of the first arm links 931 and 932 of the first and second robot arms 910a and 910b angularly moved with respect to the other of the first arm links 931 and 932 of the first and second robot arms 910a and 910b.

The conventional robot apparatus 900, however, encounters such a problem that the second and third links 962 and 963 respectively tends to interfere with the first arm links 931 and 932 of the first and second robot arms 910a and 910b as the first and second driving shafts 921 and 922 are respectively pivoted clockwise and counterclockwise around the pivotal axis. This leads to the fact that the pivotal movement range is limited in response to the outside diameters of the second link 962, the third link 963 and the first arm links 931 and 932 of the first and second robot arm 910a and 910, the distance between the central line of the second link 962 and the central line of the first arm link 931 of the first robot arm 910a, and the distance between the central line of the third link 963 and the central line of the first arm link 932 of the second robot arm 910a.

SUMMARY OF THE INVENTION

It is, therefore, an object of the present invention to provide a robot arm mechanism and a robot apparatus which can be simple in construction and downsized.

It is an another object of the present invention to provide a robot arm mechanism and a robot apparatus which can be inexpensive in production cost.

It is a further object of the present invention to provide a robot arm mechanism and a robot apparatus which can enhance the reliability of the operation of the robot arm to ensure that the preset angle defined between the central line of the second arm link of the first robot arm and the central line of the second arm link of the second robot arm is kept substantially fixed while the first and second driving shafts are respectively pivoted clockwise and counterclockwise around the pivotal axis within the pivotal movement range wider than the pivotal movement range of the conventional robot arm.

It is still further object of the present invention to provide a robot arm mechanism and a robot apparatus which can produce no dust to be fallen in the vacuum working chamber of highly pure air.

According to the first aspect of the present invention, there is provided a robot arm mechanism, comprising: a first handling member for supporting and handling a first object; a second handling member for supporting and handling a second object; a first robot arm including a first arm link having a first end portion, a second end portion and a central line passing through the first end portion and the second end portion, and a second arm link having a first end portion, a second end portion and a central line passing through the first end portion and the second end portion, the first end portion of the second arm link being pivotably connected to the second end portion of the first arm link, and the second end portion of the second arm link being connected to the first handling member to allow the first handling member to support the first object in a stable condition; a second robot arm including a first arm link having a first end portion, a second end portion and a central line passing through the first end portion and the second end portion, and a second arm link having a first end portion, a second end portion, a central line passing through the first end portion and the second end portion, the first end portion of the second arm link being pivotably connected to the second end portion of the first arm link, the second arm link being inclined with respect to the second arm link of the first robot arm at a preset angle defined between the central line of the second arm link of the second robot arm and the central line of the second arm link of the first robot arm, and the second end portion of the second arm link being connected to the second handling member to allow the second handling member to support the second object in a stable condition; a robot arm moving mechanism connected to the first arm links of the first and second robot arms for allowing one of the first arm links of the first and second robot arms to be angularly moved respect to the other of the first arm links of the first and second robot arms; and an angle keeping mechanism connected to the second arm links of the first and second robot arms for keeping substantially fixed the preset angle defined between the central line of the second arm link of the second robot arm and the central line of the second arm link of the first robot arm as one of the first arm links of the first and second robot arms is angularly moved with respect to the other of the first arm links of the first and second robot arms.

According to the second aspect of the present invention, there is provided a robot apparatus, comprising: a robot arm mechanism, including: a first handling member for supporting and handling a first object; a second handling member for supporting and handling a second object; a first robot arm including a first arm link having a first end portion, a second end portion, and a central line passing through the first end portion and the second end portion, and a second arm link having a first end portion, a second end portion, and a central line passing through the first end portion and the second end portion, the first end portion of the second arm link being pivotably connected to the second end portion of the first arm link, and the second end portion of the second arm link being connected to the first handling member to allow the first handling member to support the first object in a stable condition; a second robot arm including a first arm link having a first end portion, a second end portion, and a central line passing through the first end portion and the second end portion, and a second arm link having a first end portion, a second end portion, and a central line passing through the first end portion and the second end portion, the first end portion of the second arm link being pivotably connected to the second end portion of the first arm link, the second arm link being inclined with respect to the second arm link of the first robot arm having a preset angle defined between the central line of the second arm link of the second robot arm and the central line of the second arm link of the first robot arm, and the second end portion of the second arm link being connected to the second handling member to allow the second handling member to support the second object in a stable condition; a robot arm moving mechanism connected to the first arm links of the first and second robot arms for allowing one of the first arm links of the first and second robot arms to be angularly moved respect to the other of the first arm links of the first and second robot arms; and an angle keeping mechanism connected to the second arm links of the first and second robot arms for keeping substantially fixed the preset angle defined between the central line of the second arm link of the second robot arm and the central line of the second arm link of the first robot arm as one of the first arm links of the first and second robot arms is angularly moved with respect to the other of the first arm links of the first and second robot arms. The robot apparatus further comprises a first driving motor for driving one of the first arm links of the first robot arm and the second robot arm; and a second driving motor for driving the other of the first arm links of the first robot arm and the second robot arm.

BRIEF DESCRIPTION OF THE DRAWINGS

The present invention and many of the attendant advantages thereof will be better understood from the following detailed description when considered in connection with the accompanying drawings, wherein.

DESCRIPTION OF THE EMBODIMENTS

Figure 1:
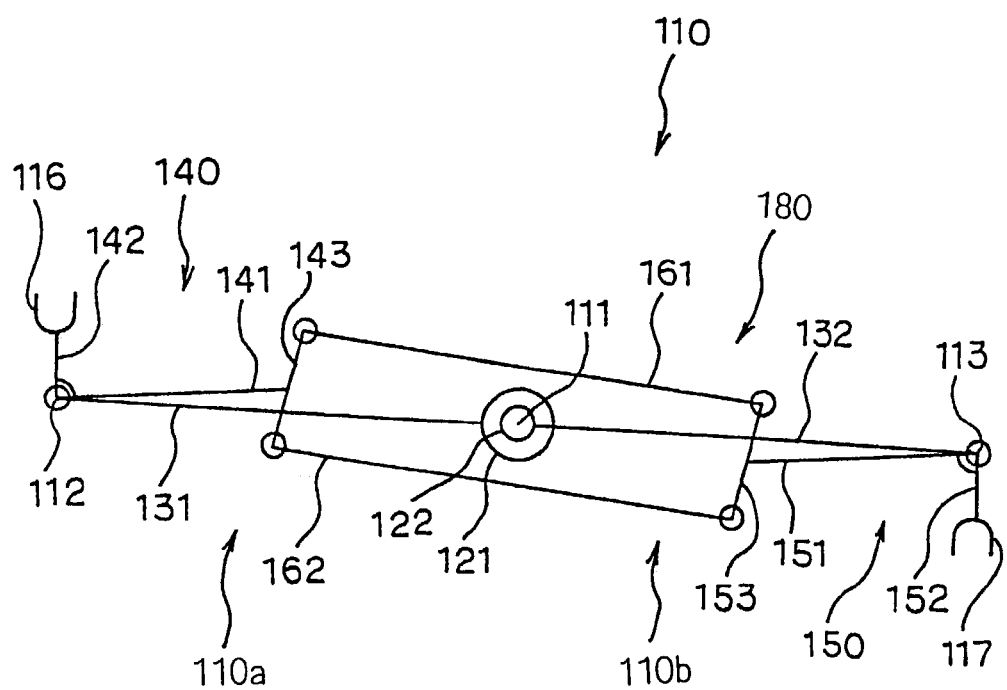
FIG. 1 is a skeleton view of the first embodiment of the robot arm mechanism and the robot apparatus according to the present invention under one of its conditions.

The embodiments of the robot arm mechanism and the robot apparatus according to the present invention will now be described with reference to FIGS. 1 to 15. Throughout the following detailed description, similar reference characters and numbers refer to respective similar elements in all figures of the drawings.

The constitution of the first embodiment of the robot arm mechanism and the robot apparatus according to the present invention will firstly be described with reference to FIGS. 1 to 5.

Figure 2:
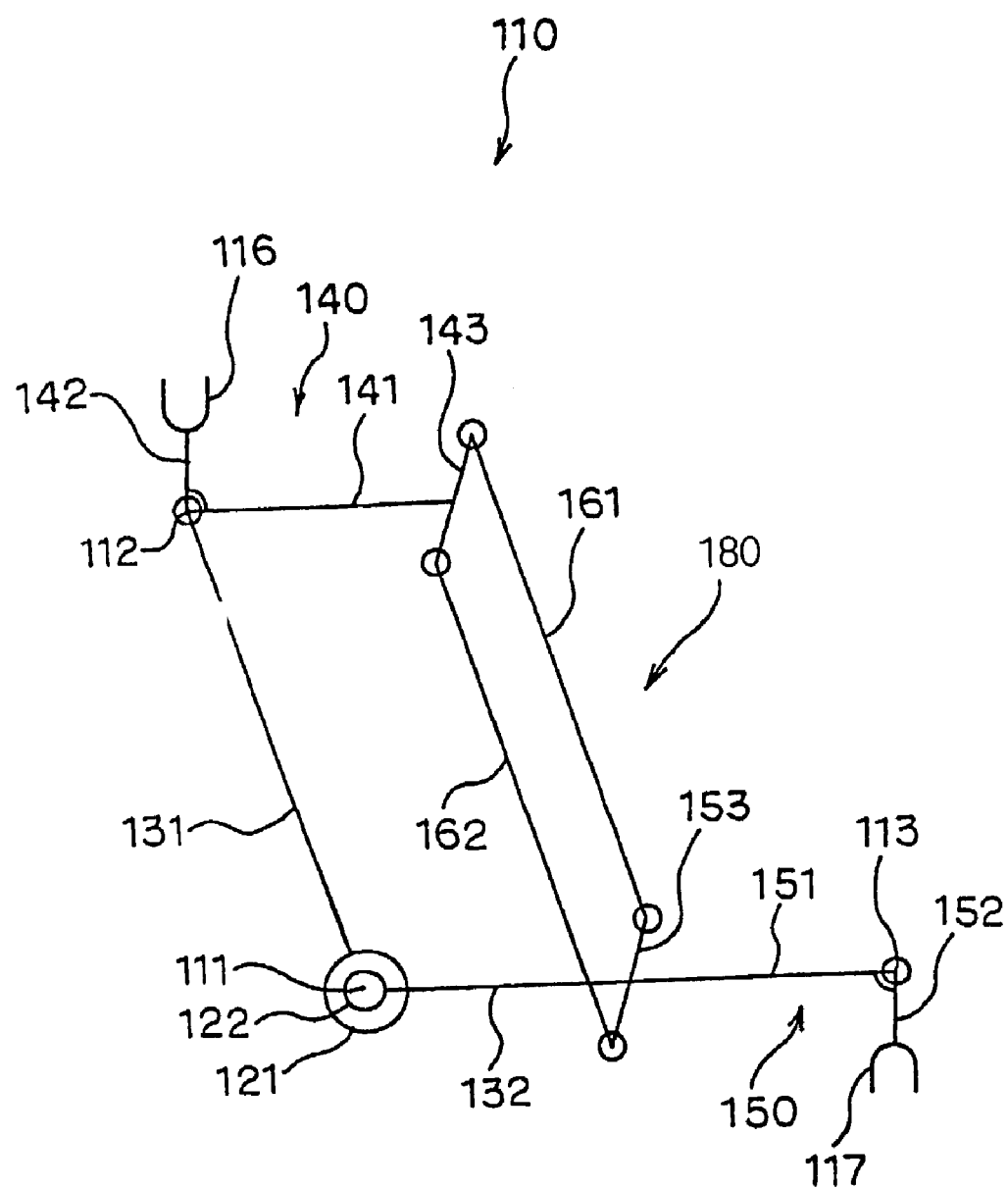
FIG. 2 is a skeleton view of the first embodiment of the robot arm mechanism and the robot apparatus according to the present invention under the other of its conditions.

The robot arm mechanism 110 is shown in FIGS. 1 and 2 as comprising a first handling member 116 for supporting and handling a first object, and a second handling member 117 for supporting and handling a second object. The first and second handling members 116 and 117 are configured to be available for handling, i.e., holding and releasing a wafer and other materials to be used for producing semiconductors. The configurations of the first and second handling members 116 and 117 respectively depend upon the sizes and shapes of the materials to be handled by the first and second handling members 116 and 117.

The robot arm mechanism 110 further comprises a first robot arm 110a and a second robot arm 110b. The first robot arm 110a includes a first arm link 131 having a first end portion, a second end portion, and a central line passing through the first end portion and the second end portion, and a second arm link 142 having a first end portion, a second end portion, and a central line passing through the first end portion and the second end portion. The first end portion of the second arm link 142 is pivotably connected to the second end portion of the first arm link 131, while the second end portion of the second arm link 142 is connected to the first handling member 116 to allow the first handling member 116 to support the first object in a stable condition.

The second robot arm 110b includes a first arm link 132 having a first end portion, a second end portion, and a central line passing through the first end portion and the second end portion, and a second arm link 152 having a first end portion, a second end portion, and a central line passing through the first end portion and the second end portion. The second arm link 152 forming part of the second robot arm 110b is inclined with respect to the second arm link 142 forming part of the first robot arm 110a at a preset angle defined between the central line of the second arm link 152 of the second robot arm 110b and the central line of the second arm link 142 of the first robot arm 110a.

The first end portion of the second arm link 152 is pivotably connected to the second end portion of the first arm link 132, while the second end portion of the second arm link 152 is connected to the second handling member 117 to allow the second handling member 117 to support the second object in a stable condition.

The robot arm mechanism 110 further comprises a robot arm moving mechanism 170 (see FIG. 3) for allowing one of the first arm links 131 and 132 of the first and second robot arms 110a and 110b to be angularly moved with respect to the other of the first arm links 131 and 132 of the first and second robot arms 110a to 110b. The robot arm mechanism 110 further comprises an angle keeping mechanism 180 for keeping substantially fixed the preset angle defined between the central line of the second arm link 152 of the second robot arm 110b and the central line of the second arm link 142 of the first robot arm 110a as one of the first arm links 131 and 132 of the first and second robot arms 110a and 110b is angularly moved with respect to the other of the first arm links 131 and 132 of the first and second robot arms 110a and 110b.

The robot arm moving mechanism 170 includes a first driving shaft 121 connected to one of the first arm link 131 of the first robot arm 110a and the first arm link 132 of the second robot arm 110b, a second driving shaft 122 having a pivotal axis 111 to be pivotable around the pivotal axis 111 and connected to the other of the first arm link 131 of the first robot arm 110a and the first arm link 132 of the second robot arm 110b, and first driving shaft 121 made in the form of a hollow shape to pivotably receive therein the second driving shaft 122 and pivotable around the pivotal axis 111.

The angle keeping mechanism 180 includes a pair of first parallel links 143 and 153 and a pair of second parallel links 161 and 162. The first parallel links 143 and 153 each has a first end portion, a second end portion, a longitudinally intermediate portion intervening between the first end portion and the second end portion, and a central line passing through the first end portion and the second end portion. One of the first parallel links 143 and 153 is substantially equal in length to the other of the first parallel links 143 and 153. The second parallel links 161 and 162 each has a first end portion, a second end portion, and a central line passing through the first end portion and the second end portion. One of the second parallel links 161 and 162 is substantially equal in length to the other of the first parallel links 161 and 162.

The second end portion of one of the first parallel links 143 and 153 is pivotably connected to the first end portion of one of the second parallel links 161 and 162, while the second end portion of one of the second parallel links 161 and 162 is pivotably connected to the second end portion of the other of the first parallel links 143 and 153. The first end portion of the other of the second parallel links 143 and 153 is pivotably connected to the first end portion of the other of the second parallel links 161 and 162, while the second end portion of the other of the second parallel links 161 and 162 is pivotably connected to the first end portion of one of the first parallel links 143 and 153.

The angle keeping mechanism 180 further includes a first intermediate link 141 intervening between the second arm link 142 and one of the first parallel links 143 and 153, and a second intermediate link 151 intervening between the second arm link 152 and the other of the first parallel links 143 and 153. The first intermediate link 141 has a first end portion, a second end portion, and a central line passing through the first end portion and the second end portion. The second intermediate link 151 has a first end portion, a second end portion, and a central line passing through the first end portion and the second end portion.

The first end portion of the first intermediate link 141 is pivotably connected to the second end portion of the first arm link 131 of the first robot arm 110a, while the first intermediate link 141 is integrally formed with the second arm link 142 of the first robot arm 110a under the state that the first end portion of the first intermediate link 141 is connected to the first end portion of the second arm link 142 of the first robot arm 110a. The first intermediate link 141 is integrally formed with one of the first parallel links 143 and 153 under the state that the second end portion of the first intermediate link 141 is connected to the longitudinally intermediate portion of one of the first parallel links 143 and 153.

The first end portion of the second intermediate link 151 is pivotably connected to the second end portion of the first arm link 132 of the second robot arm 110b, while the second intermediate link 151 is integrally formed with the second arm link 152 of the second robot arm 110b under the state that the first end portion of the second intermediate link 151 is connected to the first end portion of the second arm link 152 of the second robot arm 110b. The second intermediate link 151 is integrally formed with the other of the first parallel links 143 and 153 under the state that the second end portion of the second intermediate link 151 is connected to the longitudinally intermediate portion of the other of the first parallel links 143 and 153.

The angle keeping mechanism 180 is operative to keep substantially fixed the preset angle defined between the central line of the second arm link 152 of the second robot arm 110b and the central line of the second arm link 142 of the first robot arm 110a under the state that the first and second driving shafts 121 and 122 are respectively pivoted clockwise and counterclockwise around the pivotal axis 111 to have one of the first arm links 131 and 132 of the first and second robot arms 110a and 110b angularly moved with respect to the other of the first arm links 131 and 132 of the first and second robot arms 110a and 110b.

The first intermediate link 141 is inclined with respect to first arm link 131 forming part of the first robot arm 110a at a first inclination angle defined between the central line of the first intermediate link 141 and the central line of the first arm link 131 of the first robot arm 110a. The second intermediate link 151 is inclined with respect to the first arm link 132 forming part of the second robot arm 110b at a second inclination angle defined between the central line of the second intermediate link 151 and the central line of the first arm link 132 of the second robot arm 110b. The first inclination angle defined between the central line of the first intermediate link 141 and the central line of the first arm link 131 of the first robot arm 110a is substantially equal to the second inclination angle defined between the central line of the second intermediate link 151 and the central line of the first arm link 132 of the second robot arm 110b under the state that the first and second driving shafts 121 and 122 are respectively pivoted clockwise and counterclockwise around the pivotal axis 111 to have the central lines of the first arm links 131 and 132 of the first and second robot arms 110a and 110b axially aligned with each other. The first intermediate link 141 is substantially equal in length to the second intermediate link 151.

Figure 3:
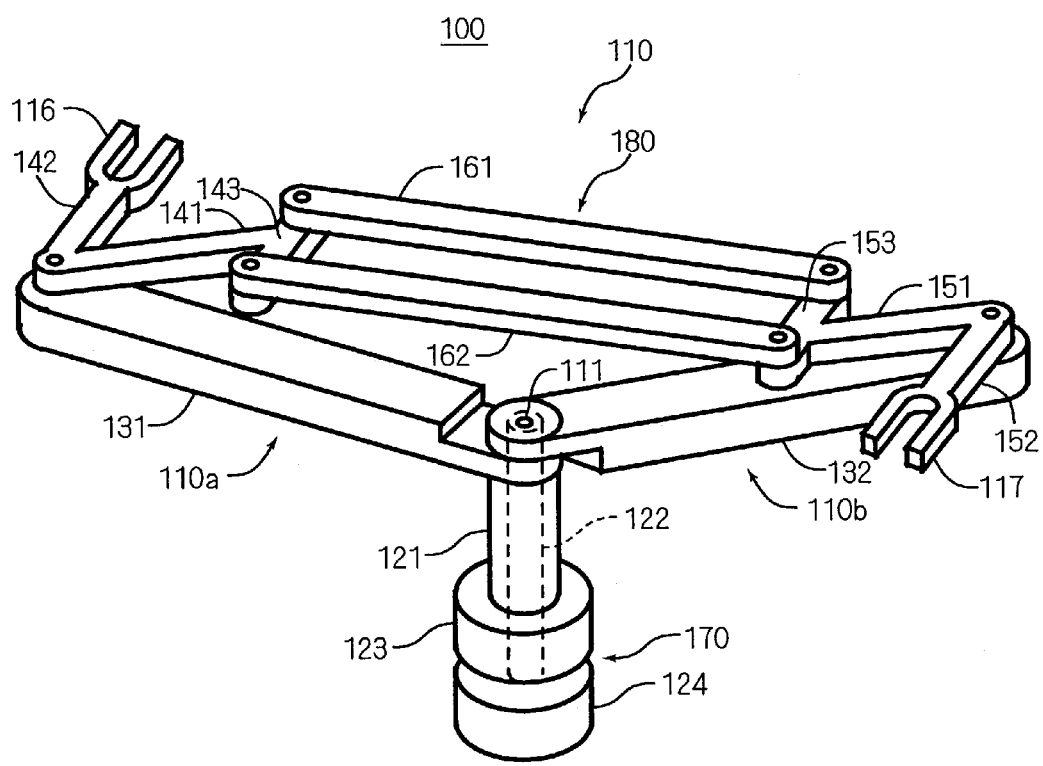
FIG. 3 is a perspective view of the first embodiment of the robot arm mechanism and the robot apparatus according to the present invention.
Figure 4:
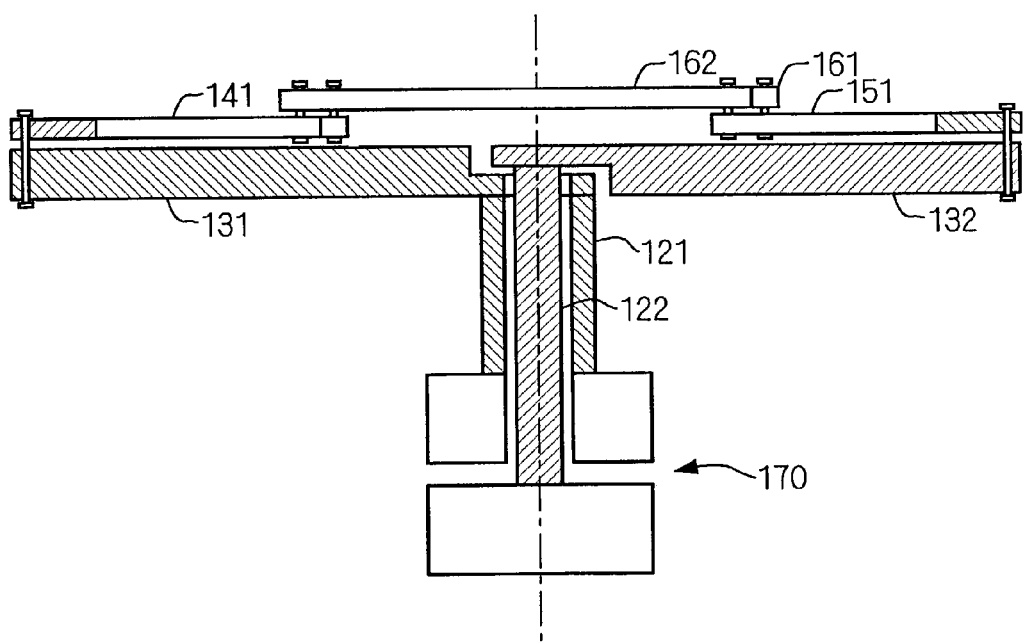
FIG. 4 is a cross-sectional view of the first embodiment of the robot arm mechanism and the robot apparatus according to the present invention.

As shown in FIGS. 3 and 4, the robot apparatus 100 further comprises a first driving motor 123 for driving the first driving shaft 121 around the pivotal axis 111 to have one of the first robot arm 110a and the second robot arm 110b angularly moved with respect to the first driving shaft 121, and a second driving motor 124 for driving the second driving shaft 122 around the pivotal axis 111 to have the other of the first robot arm 110a and the second robot arm 110b angularly moved with respect to the second driving shaft 122.

In the operation of the robot apparatus 100 according to the first embodiment of the present invention, the first robot arm 110a is contracted and extended with the substantially fixed preset angle defined between the central line of the second arm link 152 of the second robot arm 110b and the central line of the second arm link 142 of the first robot arm 110a under the state that the first driving shaft 121 is driven by the first driving motor 170a to have the first driving shaft 121 pivot around clockwise and counterclockwise the pivotal axis 111.

The second robot arm 110b is, on the other hand, contracted and extended with the substantially fixed preset angle defined between the central line of the second arm link 152 of the second robot arm 110b and the central line of the second arm link 142 of the first robot arm 110a under the state that the second driving shaft 122 is driven by the second driving motor 170b to have the second driving shaft 122 pivot around clockwise and counterclockwise the pivotal axis 111.

From the above detail description, it will be understood that the robot apparatus 100 according to the first embodiment of the present invention can contract and extend the first and second robot arms 110a and 110b under the state that the first and second driving shafts 121 and 122 are respectively pivoted around the pivotal axis 111 to have one of the first arm links 131 and 132 of the first and second robot arms 110a and 110b angularly moved with respect to the other of the first arm links 131 and 132 of the first and second robot arms 110a and 110b.

The robot apparatus 100 according to the first embodiment of the present invention can keep substantially fixed the preset angle defined between the central line of the second arm link 152 of the second robot arm 110b and the central line of the second arm link 142 of the first robot arm 110a under the state that the first and second driving shafts 121 and 122 are respectively pivoted around the pivotal axis 111 to have one of the first arm links 131 and 132 of the first and second robot arms 110a and 110b angularly moved with respect to the other of the first arm links 131 and 132 of the first and second robot arms 110a and 110b.

The robot apparatus 100 according to the first embodiment of the present invention can allow the first and second robot arms 110a and 110b to be rotated around the pivotal axis 111 under the state that the first and second driving shafts 121 and 122 are pivoted as one shaft around the pivotal axis 111.

Figure 5:
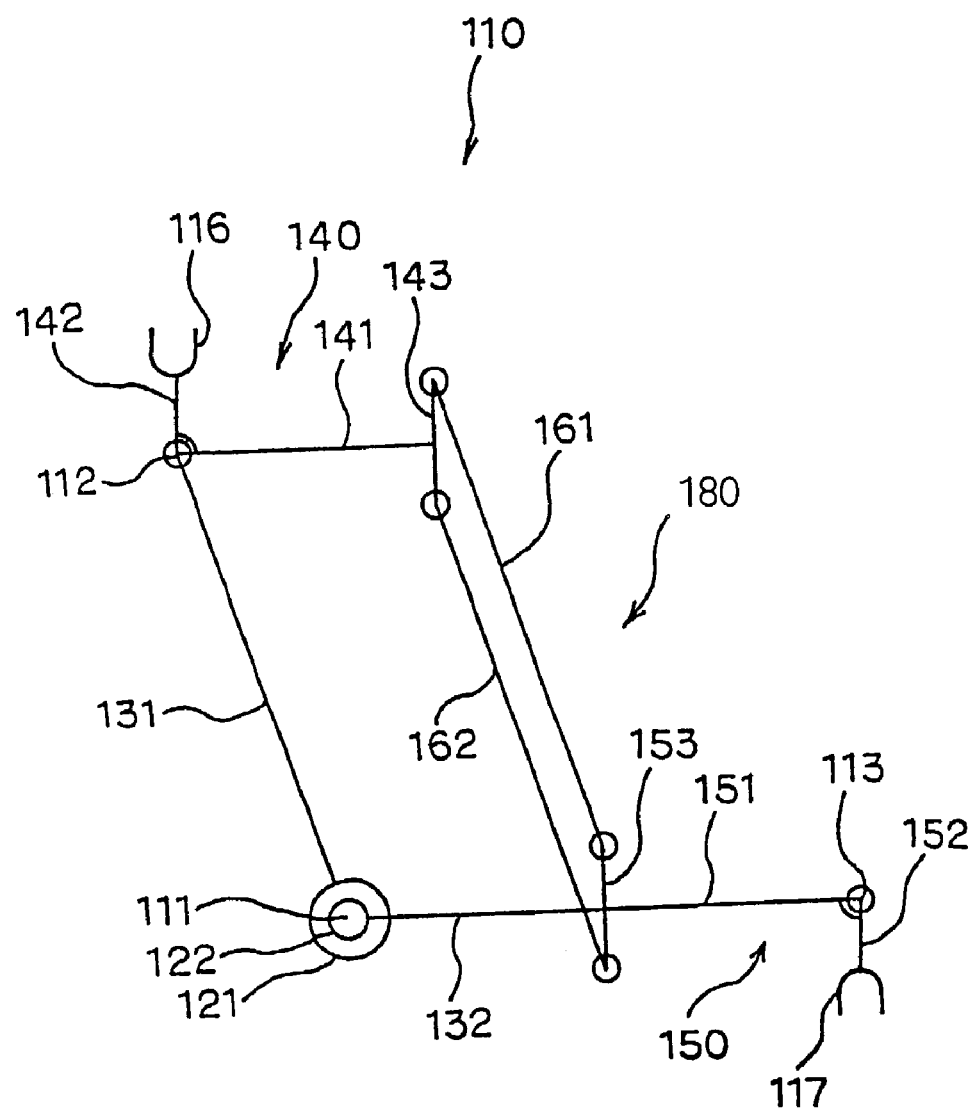
FIG. 5 is a skeleton view of one modification of the first embodiment of the robot arm mechanism and the robot apparatus according to the present invention.

The first intermediate link 141, as shown in FIG. 5, may be integrally formed with one of the first parallel links 143 and 153 under the state that the central line of the first intermediate link 141 is perpendicular with the central line of one of the first parallel links 143 and 153. The second intermediate link 151, on the other hand, may be integrally formed with the other of the first parallel links 143 and 153 under the state that the central line of the second intermediate link 151 and is perpendicular with the central line of the other of the first parallel links 143 and 153.

Although there has been described in the above about the first embodiment of the robot arm mechanism according to the present invention, this embodiment may be replaced by the second to fourth embodiments of the robot arm mechanism according to the present invention in order to attain the objects of the present invention. The second to fourth embodiments of the robot arm mechanism will then be described hereinafter.

The constitution of the second embodiment of the robot arm mechanism and robot apparatus according to the present invention will firstly be described with reference to FIG. 6.

Figure 6:
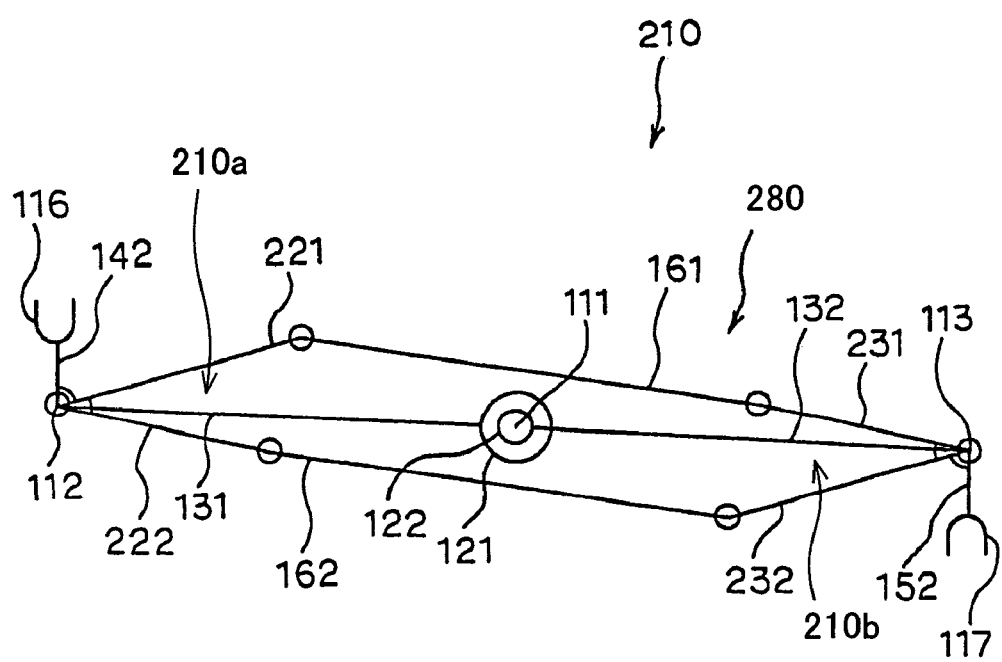
FIG. 6 is a skeleton view of the second embodiment of the robot arm mechanism and the robot apparatus according to the present invention.

The robot arm mechanism 210 is shown in FIG. 6 as comprising a first handling member 116 for supporting and handling a first object, a second handling member 117 for supporting and handling a second object, a first robot arm 210a, and a second robot arm 210b.

The first robot arm 210a includes a first arm link 131 having a first end portion, a second end portion, and a central line passing through the first end portion and the second end portion, and a second arm link 142 having a first end portion, a second end portion, and a central line passing through the first end portion and the second end portion. The first end portion of the second arm link 142 is pivotably connected to the second end portion of the first arm link 131, while the second end portion of the second arm link 142 is connected to the first handling member 116 to allow the first handling member 116 to support the first object in a stable condition.

The second robot arm 210b includes a first arm link 132 having a first end portion, a second end portion, and a central line passing through the first end portion and the second end portion, and a second arm link 152 having a first end portion, a second end portion, and a central line passing through the first end portion and the second end portion. The first end portion of the second arm link 152 is pivotably connected to the second end portion of the first arm link 132, while the second end portion of the second arm link 152 is connected to the second handling member 117 to allow the second handling member 117 to support the second object in a stable condition. The second arm link 152 forming part of the second robot arm 210b is inclined with respect to the second arm link 142 forming part of the first robot arm 210a at a preset angle defined between the central line of the second arm link 152 of the second robot arm 210b and the central line of the second arm link 142 of the first robot arm 210a.

The robot arm mechanism 210 further comprises a robot arm moving mechanism (not shown) and an angle keeping mechanism 280. The robot arm moving mechanism is operative to have one of the first arm links 131 and 132 of the first and second robot arms 210a and 210b angularly move with respect to the other of the first arm links 131 and 132 of the first and second robot arms 210a to 210b. The angle keeping mechanism 280 is operative to keep substantially fixed the preset angle defined between the central line of the second arm link 152 of the second robot arm 210b and the central line of the second arm link 142 of the first robot arm 210a as one of the first arm links 131 and 132 of the first and second robot arms 210a and 210b is angularly moved with respect to the other of the first arm links 131 and 132 of the first and second robot arms 210a and 210b.

The angle keeping mechanism 280 includes a pair of parallel links 161 and 162, a first intermediate link 221 intervening between the second arm link 142 of the first robot arm 210a and one of the parallel links 161 and 162, a second intermediate link 222 intervening between the second arm link 142 of the first robot arm 210a and the other of the parallel links 161 and 162, a third intermediate link 231 intervening between the second arm link 152 of the second robot arm 210b and one of the parallel links 161 and 162, and a fourth intermediate link 232 intervening between the second arm link 152 of the second robot arm 210b and the other of the parallel links 161 and 162. The parallel links 161 and 162 each has a first end portion, a second end portion, and a central line passing through the first end portion and the second end portion. One of the parallel links 161 and 162 is substantially equal in length to the other of the parallel links 161 and 162.

The first intermediate link 221 has a first end portion, a second end portion, and a central line passing through the first end portion and the second end portion, while the second intermediate link 222 has a first end portion, a second end portion, and a central line passing through the first end portion and the second end portion. The third intermediate link 231 has a first end portion, a second end portion, and a central line passing through the first end portion and the second end portion, while the fourth intermediate link 232 has a first end portion, a second end portion, and a central line passing through the first end portion and the second end portion.

The first end portion of the first intermediate link 221 is pivotably connected to the second end portion of the first arm link 131 of the first robot arm 210a, while the first intermediate link 221 is integrally formed with the second arm link 142 of the first robot arm 210a under the state that the first end portion of the first intermediate link 221 is connected to the first end portion of the second arm link 142 of the first robot arm 210a. The first end portion of the second intermediate link 222 is pivotably connected to the second end portion of the first arm link 131 of the first robot arm 210a, while the second intermediate link 222 is integrally formed with the second arm link 142 of the first robot arm 210a under the state that the first end portion of the second intermediate link 222 is connected to the first end portion of the second arm link 142 of the first robot arm 210a.

The first end portion of the third intermediate link 231 is pivotably connected to the second end portion of the first arm link 132 of the second robot arm 210b, while the third intermediate link 231 is integrally formed with the second arm link 152 of the second robot arm 210b under the state that the first end portion of the third intermediate link 231 is connected to the first end portion of the second arm link 152 of the second robot arm 210b. The first end portion of the fourth intermediate link 232 is pivotably connected to the second end portion of the first arm link 132 of the second robot arm 210b, while the fourth intermediate link 232 is integrally formed with the second arm link 152 of the second robot arm 210b under the state that the first end portion of the second intermediate link 232 is connected to the first end portion of the second arm link 152 of the second robot arm 110b.

The first intermediate link 221 is substantially equal in length to the fourth intermediate link 232, while the second intermediate link 222 is substantially equal in length to the third intermediate link 231. The first intermediate link 221 is longer than the second intermediate link 222.

The first intermediate link 221 is inclined with respect to the first arm link 131 of the first robot arm 210a at a first inclination angle of the central line of the first intermediate link 221 to the central line of the first arm link 131 of the first robot arm 210a under the state that the first and second driving shafts 121 and 122 are respectively pivoted clockwise and counterclockwise around the pivotal axis 111 to have the central lines of the first arm links 131 and 132 of the first and second robot arms 210a and 210b aligned with each other. The second intermediate link 222 is inclined with respect to the first arm link 131 of the first robot arm 210a at a second inclination angle of the central line of the second intermediate link 222 to the central line of the first arm link 131 of the first robot arm 210a under the state that the first and second driving shafts 121 and 122 are respectively pivoted clockwise and counterclockwise around the pivotal axis 111 to have the central lines of the first arm links 131 and 132 of the first and second robot arms 210a and 210b aligned with each other.

The third intermediate link 231 is inclined with respect to the first arm link 132 of the second robot arm 210b at a third inclination angle of the central line of the first intermediate link 231 to the central line of the first arm link 132 of the second robot arm 210b under the state that the first and second driving shafts 121 and 122 are respectively pivoted clockwise and counterclockwise around the pivotal axis 111 to have the central lines of the first arm links 131 and 132 of the first and second robot arms 210a and 210b aligned with each other. The fourth intermediate link 232 is inclined with respect to the first arm link 132 of the second robot arm 210b at a fourth inclination angle of the central line of the fourth intermediate link 232 to the central line of the first arm link 132 of the second robot arm 210b under the state that the first and second driving shafts 121 and 122 are respectively pivoted clockwise and counterclockwise around the pivotal axis 111 to have the central lines of the first arm links 131 and 132 of the first and second robot arms 210a and 210b aligned with each other.

The first inclination angle of the central line of the first intermediate link 221 to the central line of the first arm link 131 of the first robot arm 210a is substantially equal to the fourth inclination angle of the central line of the fourth intermediate link 232 to the central line of the first arm link 132 of the second robot arm 210b under the state that the first and second driving shafts 121 and 122 are respectively pivoted clockwise and counterclockwise around the pivotal axis 111 to have the central lines of the first arm links 131 and 132 of the first and second robot arms 210a and 210b aligned with each other.

The second inclination angle of the central line of the second intermediate link 222 to the central line of the first arm link 131 of the first robot arm 210a is substantially equal to the third inclination angle of the central line of the third intermediate link 231 to the central line of the first arm link 132 of the second robot arm 210b under the state that the first and second driving shafts 121 and 122 are respectively pivoted clockwise and counterclockwise around the pivotal axis 111 to have the central lines of the first arm links 131 and 132 of the first and second robot arms 210a and 210b aligned with each other.

The first inclination angle of the central line of the first intermediate link 221 to the central line of the first arm link 131 of the first robot arm 210a is larger than the second inclination angle of the central line of the second intermediate link 222 to the central line of the first arm link 131 of the first robot arm 210a under the state that the first and second driving shafts 121 and 122 are respectively pivoted clockwise and counterclockwise around the pivotal axis 111 to have the central lines of the first arm links 131 and 132 of the first and second robot arms 210a and 210b aligned with each other.

The robot apparatus 200 further comprises a first driving motor (not shown) for driving the first driving shaft 121 around the pivotal axis 111 to have one of the first robot arm 210a and the second robot arm 210b angularly moved with respect to the first driving shaft 121; and a second driving motor (not shown) for driving the second driving shaft 122 around the pivotal axis 111 to have the other of the first robot arm 210a and the second robot arm 210b angularly moved with respect to the second driving shaft 122.

In the operation of the robot apparatus 200 according to the second embodiment of the present invention, the first robot arm 210a is contracted and extended with the substantially fixed preset angle defined between the central line of the second arm link 152 of the second robot arm 110b and the central line of the second arm link 142 of the first robot arm 110a under the state that the first driving shaft 121 is driven by the first driving motor to have the first driving shaft 121 pivot around clockwise and counterclockwise the pivotal axis 111. The second robot arms 210b is, on the other hand, contracted and extended with the substantially fixed preset angle defined between the central line of the second arm link 152 of the second robot arm 110b and the central line of the second arm link 142 of the first robot arm 110a under the state that the second driving shaft 122 is driven by the second driving motor to have the second driving shaft 122 pivot around clockwise and counterclockwise the pivotal axis 111.

From the above detail description, it will be understood that the robot apparatus 200 according to the second embodiment of the present invention can contract and extend the first and second robot arms 210a and 210b under the state that the first and second driving shafts 121 and 122 are respectively pivoted around the pivotal axis 111 to have one of the first arm links 131 and 132 of the first and second robot arms 110a and 110b angularly moved with respect to the other of the first arm links 131 and 132 of the first and second robot arms 210a and 210b.

The robot apparatus 200 according to the second embodiment of the present invention can keep substantially fixed the preset angle defined between the central line of the second arm link 152 of the second robot arm 110b and the central line of the second arm link 142 of the first robot arm 110a under the state that the first and second driving shafts 121 and 122 are respectively pivoted around the pivotal axis 111 to have one of the first arm links 131 and 132 of the first and second robot arms 210a and 210b angularly moved with respect to the other of the first arm links 131 and 132 of the first and second robot arms 210a and 210b.

The robot apparatus 200 according to the second embodiment of the present invention can allow the first and second robot arms 210a and 210b to be rotated around the pivotal axis 111 under the state that the first and second driving shafts 121 and 122 are pivoted as one shaft around the pivotal axis 111.

The following description will now be direct to the third embodiment of the robot arm mechanism and the robot apparatus according to the present invention.

The constitution of the robot arm mechanism 300 will firstly be described with reference to FIGS. 7 to 9.

Figure 7:
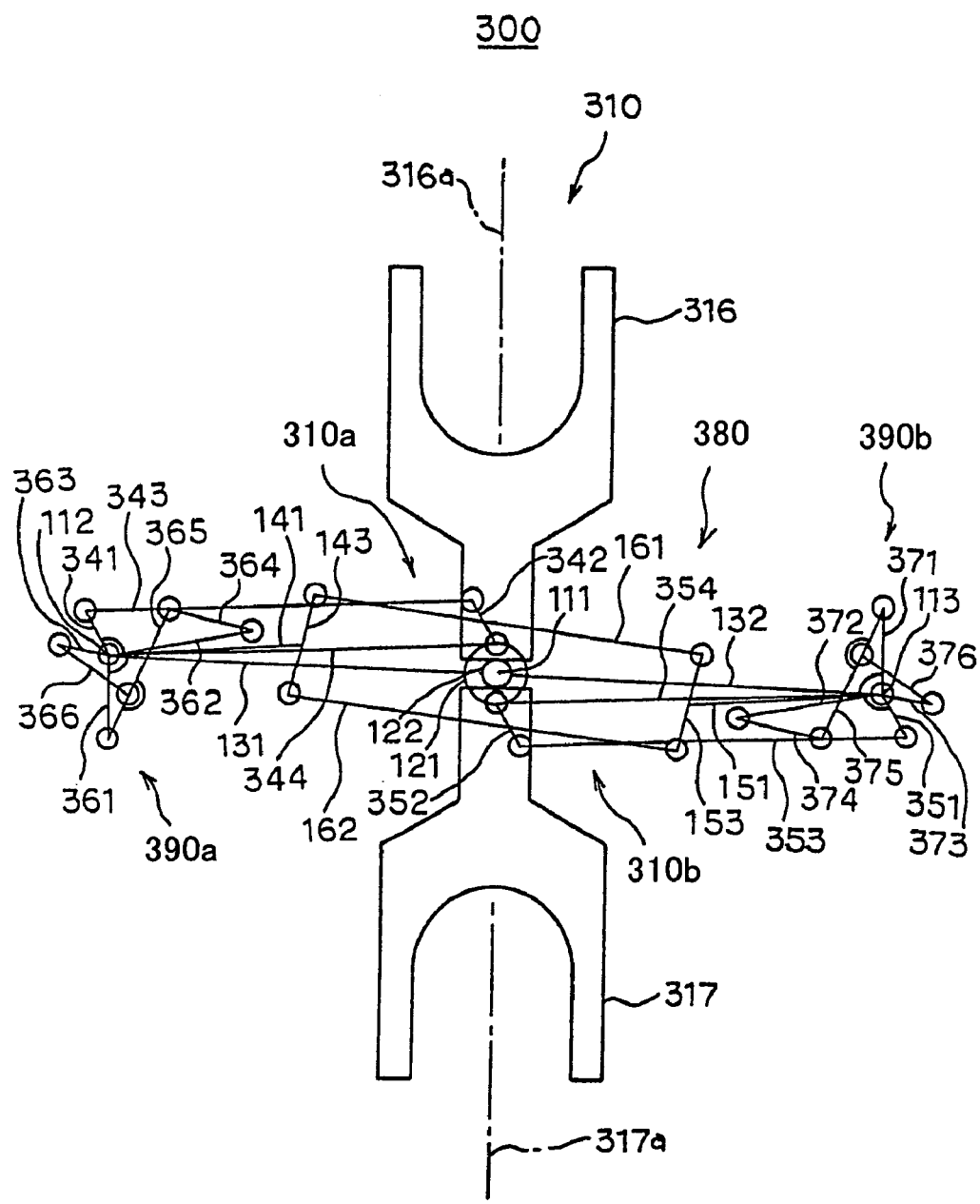
FIG. 7 is a skeleton view of the third embodiment of the robot arm mechanism and the robot apparatus according to the present invention under one of its conditions.
Figure 8:
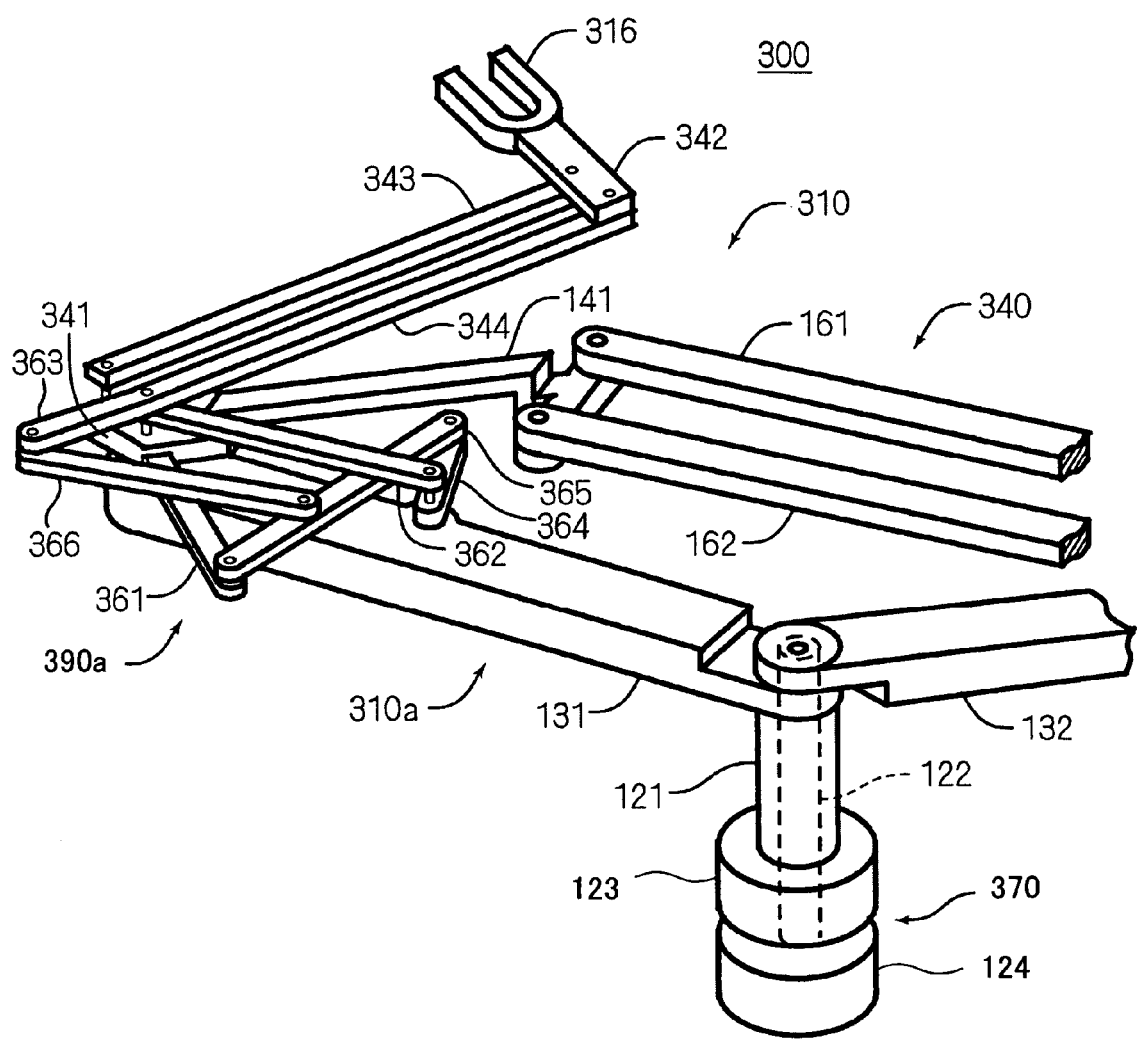
FIG. 8 is a perspective view of the third embodiment of the first angle adjusting mechanism forming part of the robot arm mechanism and the robot apparatus according to the present invention.
Figure 9:
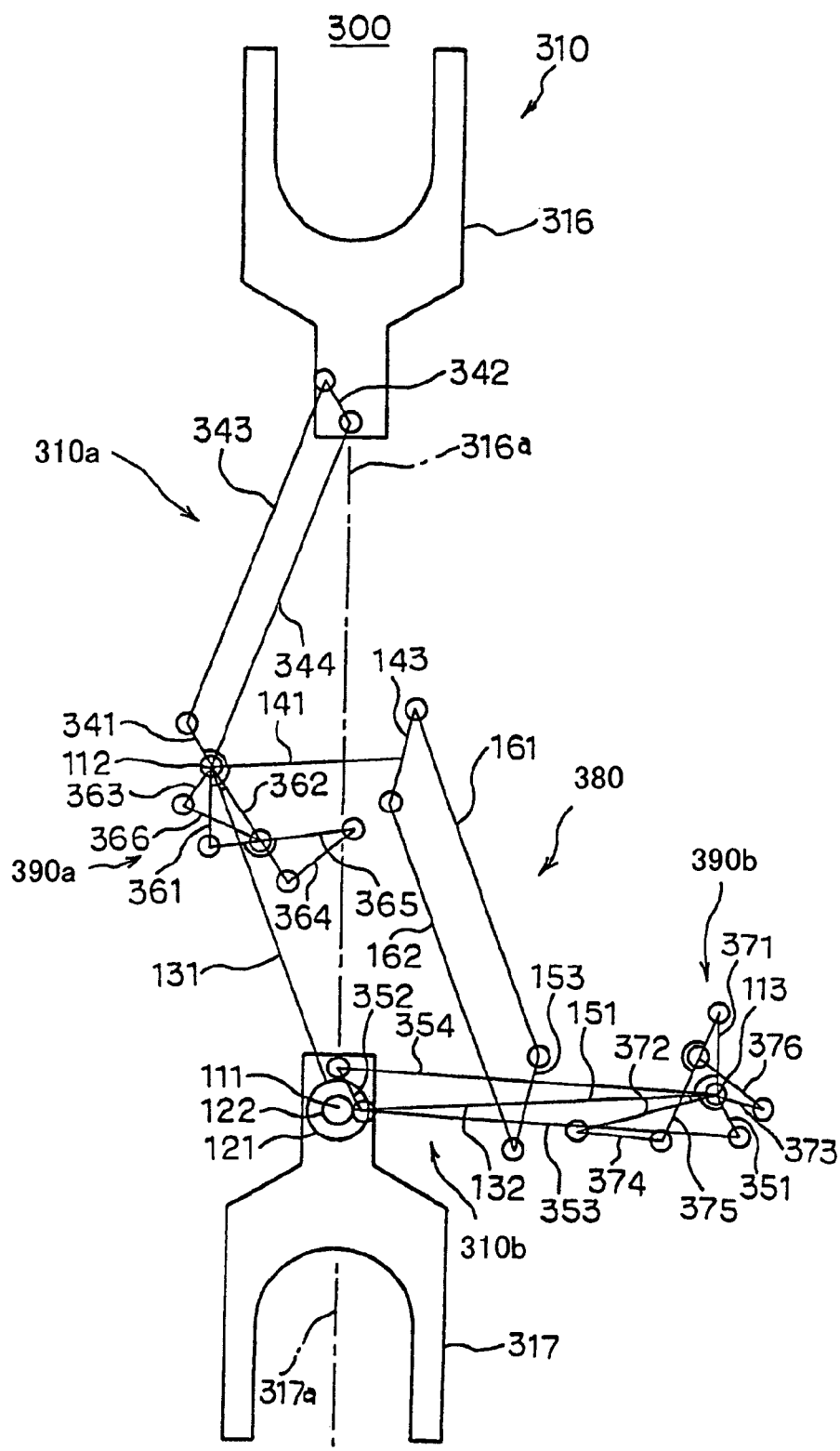
FIG. 9 is a skeleton view of the third embodiment of the robot arm mechanism and the robot apparatus according to the present invention under the other of its conditions.

The robot arm mechanism 300 is shown in FIGS. 7 to 9 as comprising a first handling member 316 for supporting and handling a first object, and a second handling member 317 for supporting and handling a second object. The first and second handling members 316 and 317 are configured to be available for handling, i.e., holding and releasing a wafer and other materials to be used for producing semiconductors. The configurations of the first and second handling members 316 and 317 respectively depend upon the sizes and shapes of the materials to be handled by the first and second handling members 316 and 317.

The robot arm mechanism 310 further comprises a first robot arm 310a and a second robot arm 310b. The first robot arm 310a includes a first arm link 131 having a first end portion, a second end portion, and a central line passing through the first end portion and the second end portion, a pair of short parallel links 341 and 342 substantially equal in length to each other and each having a first end portion, a second end portion and a central line passing through the first end portion and the second end portion, and a pair of long parallel links 343 and 344 substantially equal in length to each other and each having a first end portion, a second end portion and a central line passing through the first end portion and the second end portion. The long parallel links 343 and 344 are respectively inclined with respect to the first arm link 131 at a second angle defined between the central line of each of the long parallel links 343 and 344 and the first arm link 131.

The second end portion of the first arm link 131 is pivotably connected to the first end portion of one of the long parallel links 343 and 344, while the second end portion of one of the long parallel links 343 and 344 is pivotably connected to the first end portion of one of the short parallel links 341 and 342. The second end portion of one of the short parallel links 341 and 342 is pivotably connected to the second end portion of the other of the long parallel links 343 and 344, while the first end portion of the other of the long parallel links 343 and 344 is pivotably connected to the second end portion of the other of the short parallel links 341 and 342. The first end portion of the other of the short parallel links 341 and 342 is pivotably connected to the first end portion of one of the long parallel links 343 and 344, while the first end portion of the other of the short parallel links 341 and 342 is pivotably connected to the second end portion of the first arm link 131. One of the short parallel links 341 and 342 is connected to the first handling member 316 to allow the first handling member 316 to support the first object in a stable condition.

The second robot arm 310b includes a first arm link 132 having a first end portion, a second end portion, and a central line passing through the first end portion and the second end portion, a pair of short parallel links 351 and 352 substantially equal in length to each other and each having a first end portion, a second end portion and a central line passing through the first end portion and the second end portion, and a pair of long parallel links 353 and 354 substantially equal in length to each other and each having a first end portion, a second end portion and a central line passing through the first end portion and the second end portion.

The short parallel links 341 and 342 are respectively inclined with respect to the short parallel links 351 and 352 of the second robot arm 310b at a preset angle defined between the central line of each of the short parallel links 341 and 342 of the first robot arm 310a and the central line of each of the short parallel links 351 and 352 of the second robot arm 310b. The long parallel links 353 and 354 are respectively inclined with respect to the first arm link 132 at a second angle defined between the central line of each of the long parallel links 353 and 354 and the first arm link 132.

The second end portion of the first arm link 132 is pivotably connected to the first end portion of one of the long parallel links 353 and 354, while the second end portion of one of the long parallel links 353 and 354 is pivotably connected to the first end portion of one of the short parallel links 351 and 352. The second end portion of one of the short parallel links 351 and 352 is pivotably connected to the second end portion of the other of the long parallel links 353 and 354, while the first end portion of the other of the long parallel links 353 and 354 is pivotably connected to the second end portion of the other of the short parallel links 351 and 352. The first end portion of the other of the short parallel links 351 and 352 is pivotably connected to one of the long parallel links 353 and 354, while the first end portion of the other of the short parallel links 351 and 352 is pivotably connected to the second end portion of the first arm link 131. One of the short parallel links 351 and 352 is connected to the second handling member 317 to allow the second handling member 317 to support the first object in a stable condition.

The robot arm mechanism 310 further comprises a robot arm moving mechanism 370 (see FIG. 8) for allowing one of the first arm links 131 and 132 of the first and second robot arms 310a and 310b to be angularly moved with respect to the other of the first arm links 131 and 132 of the first and second robot arms 310a and 310b, and an angle keeping mechanism 380 for keeping substantially fixed the preset angle defined between the central line of each of the short parallel links 351 and 352 of the second robot arm 310b and the central line of each of the short parallel links 341 and 342 of the first robot arm 310*a* as one of the first arm links 131 and 132 of the first and second robot arms 310*a* and 310*b* is angularly moved with respect to the other of the first arm links 131 and 132 of the first and second robot arms 310*a* and 310*b*.

The angle keeping mechanism 380 includes a pair of first parallel links 143 and 153 substantially equal in length to each other and each having a first end portion, a second end portion, a longitudinally intermediate portion intervening between the first end portion and the second end portion and a central line passing through the first end portion and the second end portion, and a pair of second parallel links 161 and 162 substantially equal in length to each other and each having a first end portion, a second end portion and a central line passing through the first end portion and the second end portion.

The first end portion of one of the first parallel links 143 and 153 is pivotably connected to the first end portion of one of the second parallel links 161 and 162, while the second end portion of one of the second parallel links 161 and 162 is pivotably connected to the second end portion of the other of the first parallel links 143 and 153. The first end portion of the other of the second parallel links 143 and 153 is pivotably connected to the second end portion of the other of the second parallel links 161 and 162, while the first end portion of the other of the second parallel links 161 and 162 being pivotably connected to the second end portion of one of the first parallel links 143 and 153.

The angle keeping mechanism 380 further includes a first intermediate link 141 intervening between the first arm link 131 and one of the first parallel links 143 and 153 and having a first end portion, a second end portion and a central line passing through the first end portion and the second end portion, and a second intermediate link 151 intervening between the second arm link 152 and the other of the first parallel links 143 and 153 and having a first end portion, a second end portion and a central line passing through the first end portion and the second end portion.

The first end portion of the first intermediate link 141 is pivotably connected to the second end portion of the first arm link 131 of the first robot arm 310*a*. The first intermediate link 141 is integrally formed with one of short parallel links 341 and 342 of the second arm link 142 of the first robot arm 310*a* under the state that the first end portion of the first intermediate link 341 is connected to the first end portion of the other of the short parallel links 341 and 342 of the first robot arm 310*a*, while the first intermediate link 141 is integrally formed with one of the first parallel links 143 and 153 under the state that the second end portion of the first intermediate link 141 is connected to the longitudinally intermediate portion of one of the first parallel links 143 and 153.

The first end portion of the second intermediate link 151 is pivotably connected to the second end portion of the first arm link 132 of the second robot arm 310*b*. The second intermediate link 151 is integrally formed with the other of short parallel links 351 and 352 of the second robot arm 310*b* under the state that the first end portion of the second intermediate link 151 is connected to the second end portion of the other of short parallel links 351 and 352 of the second robot arm 310*b*, while the second intermediate link 151 is integrally formed with the other of the first parallel links 143 and 153 under the state that the second end portion of the second intermediate link 151 is connected to the longitudinally intermediate portion of the other of the first parallel links 143 and 153.

The robot arm moving mechanism 370 includes a first driving shaft 121 connected to one of the first arm links 131 and 132 of the first and second robot arms 310*a* and 310*b*, and a second driving shaft 122 having a pivotal axis 111 to be pivotable around the pivotal axis 111 and connected to the other of the first arm links 131 and 132 of the first and second robot arms 310*a* and 310*b*. The first driving shaft 121 is made in the form of a hollow shape to pivotably receive therein the second driving shaft 122 and is pivotable around the pivotal axis 111.

The angle keeping mechanism 380 is operative to keep substantially fixed the preset angle defined between the central line of each of the short parallel links 341 and 342 of the first robot arm 310*a* and the central line of each of the short parallel links 351 and 352 of the second robot arm 310*b* under the state that the first and second driving shafts 121 and 122 are respectively pivoted clockwise and counterclockwise around the pivotal axis 111 to have one of the first arm links 131 and 132 of the first and second robot arms 310*a* and 310*b* angularly moved with respect to the other of the first arm links 131 and 132 of the first and second robot arms 310*a* and 310*b*.

The first intermediate link 141 is inclined with respect to the first arm link 131 of the first robot arm 310*a* at a first inclination angle defined between the central line of the first intermediate link 141 and the central line of the first arm link 131 of the first robot arm 310*a*, while the second intermediate link 151 is inclined with respect to the second arm link 132 of the second robot arm 310*b* at a second inclination angle defined between the central line of the second intermediate link 151 and the central line of the first arm link 132 of the second robot arm 310*b*. The first inclination angle defined between the central line of the first intermediate link 141 to the central line of the first arm link 131 of the first robot arm 310*a* is substantially equal to the second inclination angle defined between the central line of the second intermediate link 151 and the central line of the first arm link 132 of the second robot arm 310*b* under the state that the first and second driving shafts 121 and 122 are respectively pivoted clockwise and counterclockwise around the pivotal axis 111 to have the central lines of the first arm links 131 and 132 of the first and second robot arms 310*a* and 310*b* axially aligned with each other. The first intermediate link 141 is substantially equal in length to the second intermediate link 151.

The robot arm mechanism 310 further comprises a first angle adjusting mechanism 390*a* for adjusting the first angle defined between the central line of each of the long parallel links 343 and 344 and the first arm link 131 in response to the first inclination angle defined between the central line of the first intermediate link 141 and the central line of the first arm link 131 of the first robot arm 310*a* to have the first handling member 316 move substantially straight along a predetermined first straight line 316*a* under the state that the first and second driving shafts 121 and 122 are respectively pivoted clockwise and counterclockwise around the pivotal axis 111 to have one of the first arm links 131 and 132 of the first and second robot arms 310*a* and 310*b* angularly moved with respect to the other of the first arm links 131 and 132 of the first and second robot arms 310*a* and 310*b*.

The robot arm mechanism 310 further comprises a second angle adjusting mechanism 390*b* for adjusting the second angle defined between the central line of each of the long parallel links 353 and 354 and the first arm link 132 in response to the second inclination angle defined between the central line of the second intermediate link 151 and the central line of the first arm link 132 of the second robot arm 310b to have the second handling member 317 move substantially straight along a predetermined second straight line 317a under the state that the first and second driving shafts 121 and 122 are respectively pivoted clockwise and counterclockwise around the pivotal axis 111 to have one of the first arm links 131 and 132 of the first and second robot arms 310a and 310b angularly moved with respect to the other of the first arm links 131 and 132 of the first and second robot arms 310a and 310b.

The first angle adjusting mechanism 390a includes a first link 361 having a first end portion and a second end portion, a second link 362 having a first end portion and a second end portion, a third link 363 having a first end portion, a second end portion, a fourth link 364 having a first end portion and a second end portion, a fifth link 365 having a first end portion, a second end portion and a longitudinally intermediate portion intervening between the first end portion and the second end portion and a sixth link 366 having a first end portion and a second end portion.

The first link 361 is substantially equal in length to the fourth link 364. The second link 362 is substantially equal in length to the fifth link 365. The sixth link 366 being substantially equal in length to the first link 361.

The first link 361 is integrally formed with one of the short parallel links 341 and 342 of the first robot arm 310a under the state that the first end portion of the first link 361 is connected to the first end portion of one of the short parallel links 341 and 342 of the first robot arm 310a. The second link 362 is integrally formed with the first arm link 131 of the first robot arm 310a under the state that the first end portion of the second link 362 is connected to the second end portion of the first arm link 131 of the first robot arm 310a. The third link 363 is integrally formed with one of the long parallel links 343 and 344 of the first robot arm 310a under the state that the first end portion of the third link 363 is connected to the first end portion of one of the long parallel links 343 and 344 of the first robot arm 310a.

The first end portion of the fourth link 364 is pivotably connected to the second end portion of the second link 362. The first end portion of the fifth link 365 is pivotably connected to the second end portion of the first link 361. The second end portion of the fifth link 365 is pivotably connected to the second end portion of the fourth link 364. The first end portion of the sixth end 366 is pivotably connected to the second end portion of the third link 363. The second end portion of the sixth link 366 is pivotably connected to the longitudinally intermediate portion of the fifth link 365.

The second angle adjusting mechanism 390b includes a first link 371 having a first end portion and a second end portion, a second link 372 having a first end portion and a second end portion, a third link 373 having a first end portion and a second end portion, a fourth link 374 having a first end portion and a second end portion, a fifth link 375 having a first end portion, a second end portion and a longitudinally intermediate portion intervening between the first end portion and the second end portion and a sixth link 376 having a first end portion and a second end portion.

The first link 371 is substantially equal in length to the fourth link 374. The second link 372 is substantially equal in length to the fifth link 375. The sixth link 376 being substantially equal in length to the first link 371.

The first link 371 is integrally formed with the other of the short parallel links 351 and 352 of the second robot arm 310b under the state that the first end portion of the first link 371 is connected to the first end portion of the other of the short parallel links 351 and 352 of the second robot arm 310b. The second link 372 is integrally formed with the first arm link 132 of the second robot arm 310b under the state that the first end portion of the second link 372 is connected to the second end portion of the first arm link 132 of the second robot arm 310b. The third link 373 is integrally formed with one of the long parallel links 353 and 354 of the second robot arm 310b under the state that the first end portion of the third link 373 is connected to the second end portion of one of the long parallel links 353 and 354 of the second robot arm 310b.

The first end portion of the fourth link 374 is pivotably connected to the second end portion of the second link 372. The first end portion of the fifth link 375 is pivotably connected to the second end portion of the first link 371. The second end portion of the fifth link 375 is pivotably connected to the second end portion of the fourth link 374. The first end portion of the sixth link 376 is pivotably connected to the second end portion of the third link 373. The second end portion of the sixth link 376 is pivotably connected to the longitudinally intermediate portion of the fifth link 375.

The robot apparatus 300 further comprises a first driving motor 123 (see FIG. 8) for driving the first driving shaft 121 around the pivotal axis 111 to have one of the first robot arm 310a and the second robot arm 310b angularly moved with respect to the first driving shaft 121; and a second driving motor 124 for driving the second driving shaft 122 around the pivotal axis 111 to have the other of the first robot arm 310a and the second robot arm 310b angularly moved with respect to the second driving shaft 122.

From the above detail description, it will be understood that the robot apparatus 300 according to the third embodiment of the present invention can contract and extend the first and second robot arms 310a and 310b under the state that the first and second driving shafts 121 and 122 are respectively pivoted around the pivotal axis 111 to have one of the first arm links 131 and 132 of the first and second robot arms 310a and 310b angularly moved with respect to the other of the first arm links 131 and 132 of the first and second robot arms 310a and 310b.

The robot apparatus 300 according to the third embodiment of the present invention can allow the first and second robot arms 310a and 310b to be rotated around the pivotal axis 111 under the state that the first and second driving shafts 121 and 122 are respectively pivoted as one shaft around the pivotal axis 111.

The following description will now be direct to the fourth embodiment of the robot arm mechanism and the robot apparatus according to the present invention.

The constitution of the robot arm mechanism 410 will firstly be described with reference to FIGS. 10 to 15.

Figure 10:
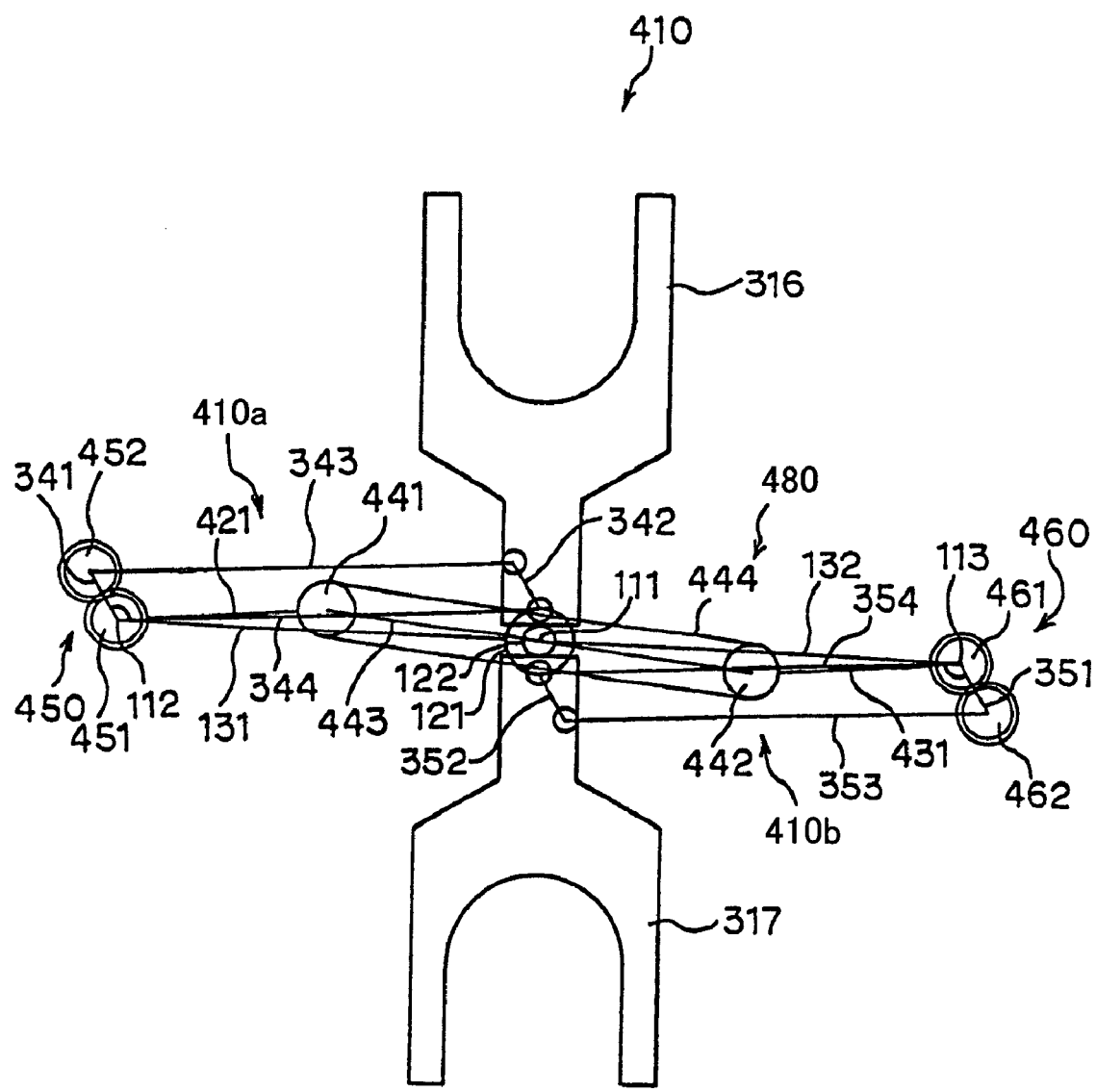
FIG. 10 is a skeleton view of the fourth embodiment of the robot arm mechanism and the robot apparatus according to the present invention under one of its conditions.
Figure 11:
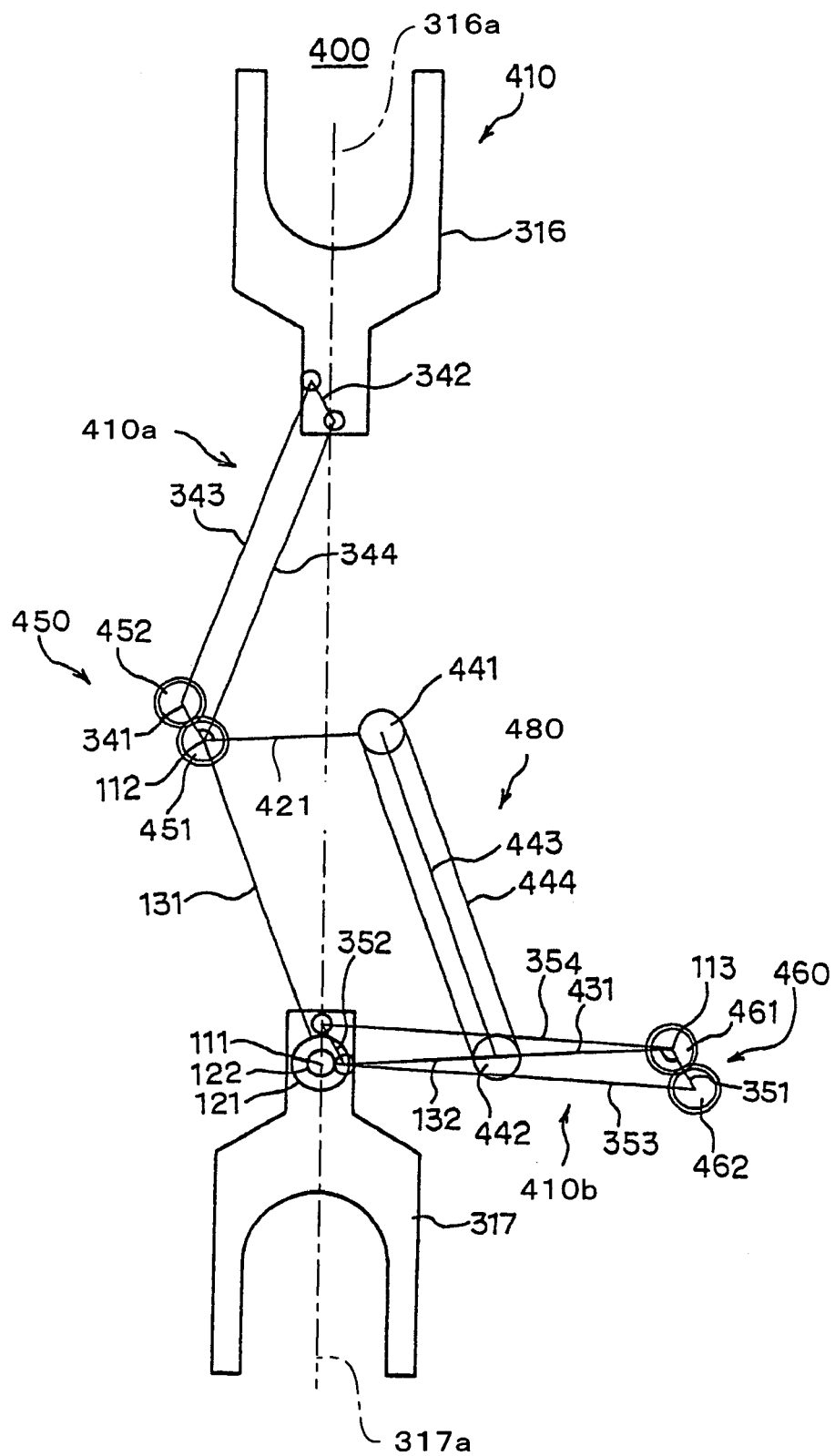
FIG. 11 is a skeleton view of the fourth embodiment of the robot arm mechanism and the robot apparatus according to the present invention under other of its conditions.
Figure 12:
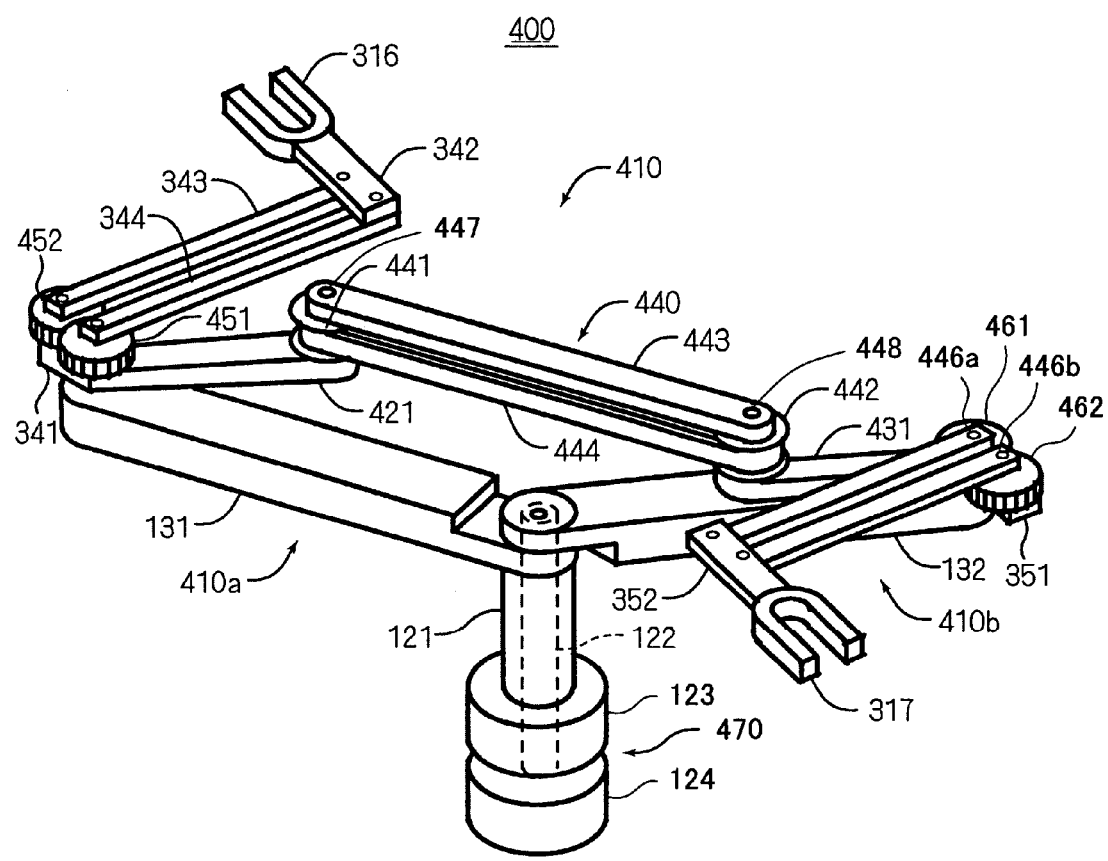
FIG. 12 is a perspective view of the fourth embodiment of the robot arm mechanism and the robot apparatus according to the present invention.
Figure 13:
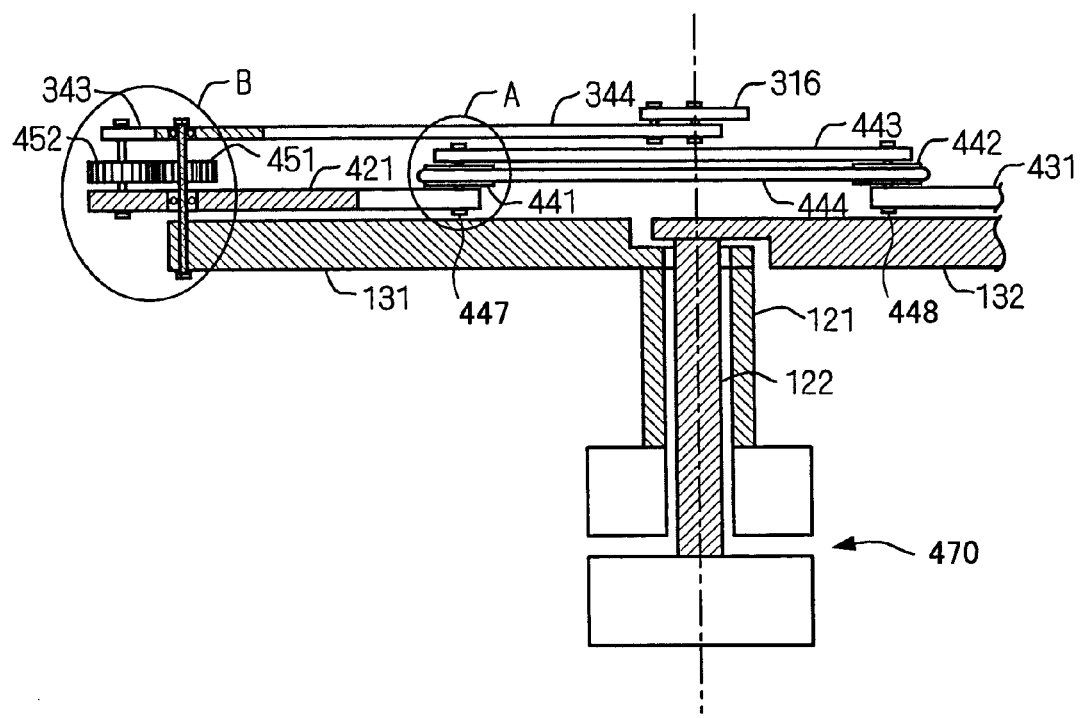
FIG. 13 is a fragmentally cross-sectional view of the fourth embodiment of the robot arm mechanism and the robot apparatus according to the present invention.
Figure 14:
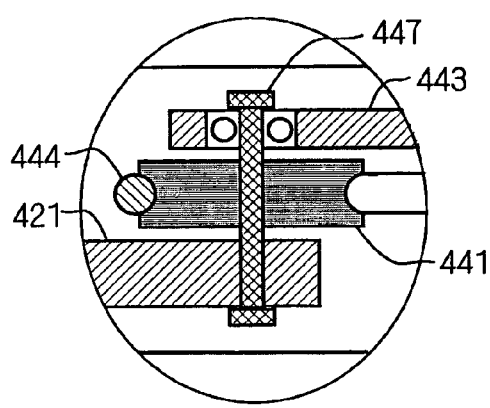
FIG. 14 is a fragmentally enlarged cross-sectional view of the fourth embodiment of the first pulley and its vicinity forming part of the robot arm mechanism and the robot apparatus according to the present invention and surrounded by a circle "A" shown in FIG. 13.
Figure 15:
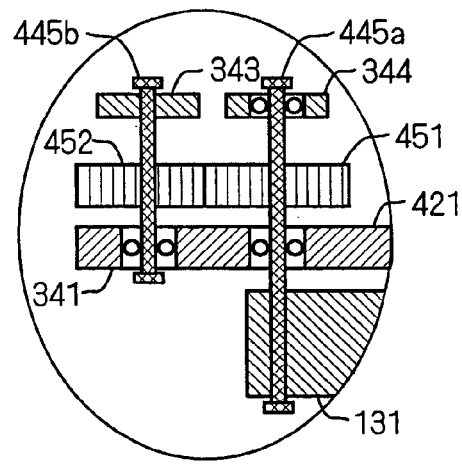
FIG. 15 is a fragmentally enlarged cross-sectional view of the fourth embodiment of the first and second gears forming part of the robot arm mechanism and the robot apparatus according to the present invention and surrounded by a circle "B" shown in FIG. 13.
Figure 16:
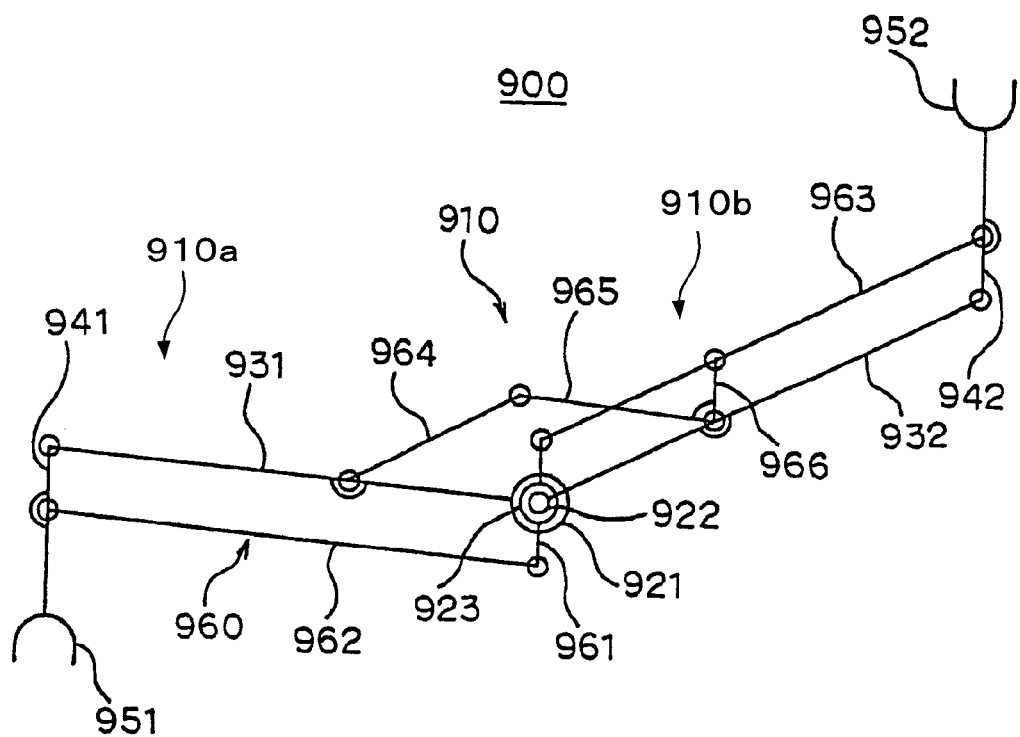
FIG. 16 is a skeleton view of the conventional robot arm mechanism.

The robot arm mechanism 410 is shown in FIG. 10 as comprising a first handling member 316 for supporting and handling a first object, and a second handling member 317 for supporting and handling a second object. The first and second handling members 316 and 317 are configured to be available for handling, i.e., holding and releasing a wafer and other materials to be used for producing semiconductors. The configurations of the first and second handling members 316 and 317 respectively depend upon the sizes and shapes of the materials to be handled by the first and second handling members 316 and 317, and the first handling member 316 may be different in shape from the second handling member 317.

The first robot arm 410a includes a first arm link 131 having a first end portion, a second end portion, and a central line passing through the first end portion and the second end portion, a pair of short parallel links 341 and 342 substantially equal in length to each other and each having a first end portion, a second end portion and a central line passing through the first end portion and the second end portion, and a pair of long parallel links 343 and 344 substantially equal in length to each other and each having a first end portion, a second end portion and a central line passing through the first end portion and the second end portion. The long parallel links 343 and 344 are respectively inclined with respect to the first arm link 131 at a first angle defined between the central line of each of the long parallel links 343 and 344 and the first arm link 131.

The second end portion of the first arm link 131 is pivotably connected to the first end portion of one of the long parallel links 343 and 344, while the second end portion of one of the long parallel links 343 and 344 is pivotably connected to the first end portion of one of the short parallel links 341 and 342. The second end portion of one of the short parallel links 341 and 342 is pivotably connected to the second end portion of the other of the long parallel links 343 and 344, while the first end portion of the other of the long parallel links 343 and 344 is pivotably connected to the second end portion of the other of the short parallel links 341 and 342. The first end portion of the other of the short parallel links 341 and 342 is pivotably connected to the first end portion of one of the long parallel links 343 and 344. One of the short parallel links 341 and 342 is connected to the first handling member 316 to allow the first handling member 316 to support the first object in a stable condition.

The second robot arm 410b includes a first arm link 132 having a first end portion, a second end portion, and a central line passing through the first end portion and the second end portion, a pair of short parallel links 351 and 352 substantially equal in length to each other and each having a first end portion, a second end portion and a central line passing through the first end portion and the second end portion, and a pair of long parallel links 353 and 354 substantially equal in length to each other and each having a first end portion, a second end portion and a central line passing through the first end portion and the second end portion.

The short parallel links 341 and 342 are respectively inclined with respect to the short parallel links 351 and 352 of the second robot arm 410b at a preset angle defined between the central line of each of the short parallel links 341 and 342 of the first robot arm 410a and the central line of each of the short parallel links 351 and 352 of the second robot arm 410b. The long parallel links 353 and 354 are respectively inclined with respect to the first arm link 132 at a second angle defined between the central line of each of the long parallel links 353 and 354 and the first arm link 132.

The second end portion of the first arm link 132 is pivotably connected to the first end portion of one of the long parallel links 353 and 354, while the second end portion of one of the long parallel links 353 and 354 is pivotably connected to the first end portion of one of the short parallel links 351 and 352. The second end portion of one of the short parallel links 351 and 352 is pivotably connected to the second end portion of the other of the long parallel links 353 and 354, while the first end portion of the other of the long parallel links 353 and 354 is pivotably connected to the second end portion of the other of the short parallel links 351 and 352. The first end portion of the other of the short parallel links 351 and 352 is pivotably connected to one of the long parallel links 353 and 354. One of the short parallel links 351 and 352 is connected to the second handling member 317 to allow the second handling member 317 to support the first object in a stable condition.

The robot arm mechanism 410 further comprises a robot arm moving mechanism 470 (see FIG. 12) for allowing one of the first arm links 131 and 132 of the first and second robot arms 410a and 410b to be angularly moved with respect to the other of the first arm links 131 and 132 of the first and second robot arms 410a and 410b, and an angle keeping mechanism 480 for keeping substantially fixed the preset angle defined between the central line of each of the short parallel links 341 and 342 of the first robot arm 410a and the central line of each of the short parallel links 351 and 352 of the second robot arm 410b as one of the first arm links 131 and 132 of the first and second robot arms 410a and 410b is angularly moved with respect to the other of the first arm links 131 and 132 of the first and second robot arms 410a and 410b.

The angle keeping mechanism 480 includes a first intermediate link 421 intervening between the first arm link 131 and one of the first parallel links 343 and 344 and having a first end portion, a second end portion and a central line passing through the first end portion and the second end portion, and a second intermediate link 431 intervening between the second arm link 132 and the other of the first parallel links 353 and 354 and having a first end portion, a second end portion and a central line passing through the first end portion and the second end portion.

The first end portion of the first intermediate link 421 is pivotably connected to the second end portion of the first arm link 131 of the first robot arm 410a. The first intermediate link 421 is integrally formed with one of short parallel links 341 and 342 of the second arm link 142 of the first robot arm 410a under the state that the first end portion of the first intermediate link 421 is connected to the second end portion of one of the short parallel links 341 and 342 of the first robot arm 410a.

The first end portion of the second intermediate link 431 is pivotably connected to the second end portion of the first arm link 132 of the second robot arm 410b. The second intermediate link 431 is integrally formed with one of short parallel links 351 and 352 of the second robot arm 410b under the state that the first end portion of the second intermediate link 431 is connected to the second end portion of one of short parallel links 351 and 352 of the second robot arm 410b, while the second intermediate link 431 is integrally formed with the other of the first parallel links 353 and 354 under the state that the second end portion of the second intermediate links 431 is connected to the longitudinally intermediate portion of the other of the first parallel links 353 and 354.

The robot arm moving mechanism 470 includes a first driving shaft 121 connected to one of the first arm links 131 and 132 of the first and second robot arms 410a and 410b, and a second driving shaft 122 having a pivotal axis 111 to be pivotable around the pivotal axis 111 and connected to the other of the first arm links 131 and 132 of the first and second robot arms 410a and 410b. The first driving shaft 121 is made in the form of a hollow shape to pivotably receive therein the second driving shaft 122 and is pivotable around the pivotal axis 111.

The angle keeping mechanism 480 is operative to keep substantially the fixed preset angle defined between the central line of each of the short parallel links 341 and 342 of the first robot arm 410a and the central line of each of the short parallel links 351 and 352 of the second robot arm 410b under the state that the first and second driving shafts 121 and 122 are respectively pivoted clockwise and counterclockwise around the pivotal axis 111 to have one of the first arm links 131 and 132 of the first and second robot arms 410a and 410b angularly moved with respect to the other of the first arm links 131 and 132 of the first and second robot arms 410a and 410b.

The first intermediate link 421 is inclined with respect to the first arm link 131 of the first robot arm 410a at a first inclination angle defined between the central line of the first intermediate link 421 and the central line of the first arm link 131 of the first robot arm 410a, while the second intermediate link 431 is inclined with respect to the first arm link 132 of the second robot arm 410b at a second inclination angle defined between the central line of the second intermediate link 431 and the central line of the first arm link 132 of the second robot arm 410b. The first inclination angle defined between the central line of the first intermediate link 421 to the central line of the first arm link 131 of the first robot arm 410a is substantially equal to the second inclination angle defined between the central line of the second intermediate link 431 and the central line of the first arm link 132 of the second robot arm 410b under the state that the first and second driving shafts 121 and 122 are respectively pivoted clockwise and counterclockwise around the pivotal axis 111 to have the central lines of the first arm links 131 and 132 of the first and second robot arms 410a and 410b axially aligned with each other. The first intermediate link 421 is substantially equal in length to the second intermediate link 431.

The robot arm mechanism 410 further comprises a first angle adjusting mechanism 390a for adjusting the first angle defined between the central line of each of the long parallel links 343 and 344 and the first arm link 131 in response to the first inclination angle defined between the central line of the first intermediate link 421 and the central line of the first arm link 131 of the first robot arm 410a to have the first handling member 316 move substantially straight along a predetermined first straight line 316a under the state that the first and second driving shafts 121 and 122 are respectively pivoted clockwise and counterclockwise around the pivotal axis 111 to have one of the first arm links 131 and 132 of the first and second robot arms 410a and 410b angularly moved with respect to the other of the first arm links 131 and 132 of the first and second robot arms 410a and 410b.

The robot arm mechanism 410 further comprises a second angle adjusting mechanism 390b for adjusting the second angle defined between the central line of each of the long parallel links 353 and 354 and the first arm link 132 in response to the second inclination angle defined between the central line of the second intermediate link 431 and the central line of the first arm link 132 of the second robot arm 410b to have the second handling member 317 move substantially straight along a predetermined second straight line 317a under the state that the first and second driving shafts 121 and 122 are respectively pivoted clockwise and counterclockwise around the pivotal axis 111 to have one of the first arm links 131 and 132 of the first and second robot arms 410a and 410b angularly moved with respect to the other of the first arm links 131 and 132 of the first and second robot arms 410a and 410b.

The angle keeping mechanism 480 further includes a first pivotal shaft 447 (see FIGS. 13 and 14) having a first end portion, a second end portion, and a central line passing through the first end portion and the second end portion, a first pulley 441 formed with a through bore and received therein the first pivotal shaft 447, a second pivotal shaft 448 having a first end portion, a second end portion, and a central line passing through the first end portion and the second end portion, a second pulley 442 formed with a through bore and received therein the second pivotal shaft 448, and a driving belt 444 stretched on the first pulley 441 and the second pulley 442 to transmit the driving force between the first pulley 441 and the second pulley 442.

The first pulley 441 is integrally formed with the first pivotal shaft 447. The first end portion of the first pivotal shaft 447 is pivotally connected to the first end portion of the third intermediate link 443, while the first pivotal shaft 447 is integrally formed with the first intermediate link 421 under the state that the second end portion of the first pivotal shaft 447 is connected to the second end portion of the first intermediate link 421. The second pulley 442 is integrally formed with the second pivotal shaft 448. The first end portion of the second pivotal shaft 448 is pivotally connected to the second end portion of the third intermediate link 443, while the second pivotal shaft 448 is integrally formed with the second intermediate link 431 under the state that the second end portion of the second pivotal shaft 448 is connected to the second end portion of the second intermediate link 431.

The angle keeping mechanism 480 is operative to keep substantially fixed the preset angle defined between the extension line of each of the short parallel links 351 and 352 of the second robot arm 410b and the extension line of each of the short parallel links 351 and 352 of the first robot arm 410a under the state that the first and second driving shafts 121 and 122 are respectively pivoted clockwise and counterclockwise around the pivotal axis 111 to have one of the first arm links 131 and 132 of the first and second robot arms 410a and 410b angularly moved with respect to the other of the first arm links 131 and 132 of the first and second robot arms 410a and 410b.

The first angle adjusting mechanism 450 includes a first gear shaft 445a having a first end portion and a second end portion, a first gear 451 formed with a through bore and received therein the first gear shaft 445a, a second gear shaft 445b having a first end portion and a second end portion, and a second gear 452 formed with a through bore and received therein the second gear shaft 445b. The first gear 451 is integrally formed with the first gear shaft 445a, while the first end portion of the first gear shaft 445a is integrally formed with the first end portion of the first arm link 131 of the first robot arm 410a. The second gear 452 is integrally formed with the second gear shaft 445b. The first end portion of the second gear shaft 445b is integrally formed with the second end portion of one of the long parallel links 343 and 344 of the first robot arm 410a, while the second end portion of the second gear shaft 445b is pivotally connected to the other of the short parallel links 341 and 342 of the first robot arm 410a.

Similarly, the second angle adjusting mechanism 460 includes a first gear shaft 446a, a first gear 461 received therein the first gear shaft 446a, a second gear shaft 446b, and a second gear 462 received therein the second gear shaft 446b. The first gear 461 is integrally formed with the first gear shaft 446a, while the first gear shaft 446a is integrally formed with the second end portion of the first arm link 132 of the second robot arm 410b. The second gear 462 is integrally formed with the second gear shaft 446b. The second gear shaft 446b is integrally formed with the other of one of the long parallel links 353 and 354 of the second robot arm 410b, while the second gear shaft 446b is pivotally connected to the other of the short parallel links 351 and 352 of the second robot arm 410b.

The robot apparatus 400 further comprises a first driving motor 123 for driving the first driving shaft 121 around the pivotal axis 111 to have one of the first robot arm 410a and the second robot arm 410b angularly moved with respect to the first driving shaft 121; and a second driving motor 124 for driving the second driving shaft 122 around the pivotal axis 111 to have the other of the first robot arm 410a and the second robot arm 410b angularly moved with respect to the second driving shaft 122.

From the above detail description, it will be understood that the robot apparatus 400 according to the fourth embodiment of the present invention can contract and extend the first and second robot arms 410a and 410b under the state that the first and second driving shafts 121 and 122 are respectively pivoted around the pivotal axis 111 to have one of the first arm links 131 and 132 of the first and second robot arms 410a and 410b angularly moved with respect to the other of the first arm links 131 and 132 of the first and second robot arms 410a and 410b.

The robot apparatus 400 according to the fourth embodiment of the present invention can allow the first and second robot arms 410a and 410b to be rotated around the pivotal axis 111 under the state that the first and second driving shafts 121 and 122 are respectively pivoted as one shaft around the pivotal axis 111.

As will be seen from the above description, the robot arm mechanism and the robot apparatus according to the present invention can be simple in construction and downsized. The robot arm mechanism and the robot apparatus according to the present invention can be inexpensive in production cost. The robot arm mechanism and the robot apparatus according to the present invention can enhance the reliability of the operation of the robot arms to ensure that the preset angle defined between the central line of each of the short parallel links of the first robot arm and the central line of each of the short parallel links of the second robot arm is kept substantially fixed while the first and second driving shafts are respectively pivoted clockwise and counterclockwise around the pivotal axis within the pivotal movement range wider than the pivotal movement range of the conventional robot arm. The robot arm mechanism and the robot apparatus according to the present invention can produce no dust to be fallen in the vacuum working chamber of highly pure air.

While the subject invention has been described with relation to the embodiments, various modifications and adaptations thereof will now be apparent to those skilled in the art as far as such modifications and adaptations fall within the scope of the appended claims intended to be covered thereby.

What is claimed is:

1. A robot arm mechanism, comprising:
   a first handling member for supporting and handling a first object;
   a second handling member for supporting and handling a second object;
   a first robot arm including a first arm link having a first end portion, a second end portion and a central line passing through said first end portion and said second end portion, and a second arm link having a first end portion, a second end portion and a central line passing through said first end portion and said second end portion, said first end portion of said second arm link being pivotably connected to said second end portion of said first arm link, and said second end portion of said second arm link being connected to said first handling member to allow said first handling member to support said first object in a stable condition;
   a second robot arm including a first arm link having a first end portion, a second end portion and a central line passing through said first end portion and second end portion, and a second arm link having a first end portion, a second end portion, a central line passing through said first end portion and said second end portion, said first end portion of said second arm link being pivotably connected to said second end portion of said first arm link, said second arm link being inclined with respect to said second arm link of said first robot arm at a preset angle defined between said central line of said second arm link of said second robot arm and said central line of said second arm link of said first robot arm, and said second end portion of said second arm link being connected to said second handling member to allow said second handling member to support said second object in a stable condition;
   a robot arm moving mechanism connected to said first arm links of said first and second robot arms for allowing one of said first arm links of said first and second robot arms to be angularly moved respect to the other of said first arm links of said first and second robot arms; and
   an angle keeping mechanism connected to said second arm links of said first and second robot arms for keeping substantially fixed said preset angle defined between said central line of said second arm link of said second robot arm and said central line of said second arm link of said first robot arm as one of said first arm links of said first and second robot arms is angularly moved with respect to the other of said first arm links of said first and second robot arms.

2. A robot arm mechanism as set forth in claim 1, in which said angle keeping mechanism includes
   a pair of first parallel links each having a first end portion, a second end portion, a longitudinally intermediate portion intervening between said first end portion and said second end portion and a central line passing through said first end portion and said second end portion, one of said first parallel links being substantially equal in length to the other of said first parallel links,
   a pair of second parallel links each having a first end portion, a second end portion and a central line passing through said first end portion and said second end portion, one of said second parallel links being substantially equal in length to the other of said second parallel links, said second end portion of one of said first parallel links being pivotably connected to said first end portion of one of said second parallel links, said second end portion of one of said second parallel links being pivotably connected to said second end portion of the other of said first parallel links, said second end portion of the other of said second parallel links being pivotably connected to said first end portion of the other of said first parallel links, and said second end portion of the other of said second parallel links being pivotably connected to said first end portion of one of said first parallel links,
   a first intermediate link intervening between one of said second arm links and one of said first parallel links, said first intermediate link having a first end portion, a second end portion and a central line passing through said first end portion and said second end portion, said first end portion of said first intermediate link being pivotably connected to said second end portion of said first arm link of said first robot arm, said first intermediate link being integrally formed with said second arm link of said first robot arm under the state that said first end portion of said first intermediate link being connected to said first end portion of said second arm link of said first robot arm, and said first intermediate link being integrally formed with one of said first parallel links under the state that said second end portion of said first intermediate link is connected to said longitudinally intermediate portion of one of said first parallel links, and a second intermediate link intervening between the other of said second arm link and the other of said first parallel links, said second intermediate link having a first end portion, a second end portion and a central line passing through said first end portion and said second end portion, said first end portion of said second intermediate link being pivotably connected to said second end portion of said first arm link of said second robot arm, said second intermediate link being integrally formed with said second arm link of said second robot arm under the state that said first end portion of said second intermediate link being connected to said first end portion of said second arm link of said second robot arm, and said second intermediate link being integrally formed with the other of said first parallel links under the state that said second end portion of said second intermediate link is connected to said longitudinally intermediate portion of the other of said first parallel links.

3. A robot arm mechanism as set forth in claim 2, in which said robot arm moving mechanism includes a first driving shaft connected to one of said first arm links of said first and second robot arms, and a second driving shaft connected to the other of said first arm links of said first and second robot arms, said second driving shaft having a pivotal axis and pivotable around said pivotal axis, and said first driving shaft being made in the form of a hollow shape to pivotably receive therein said second driving shaft and pivotable around said pivotal axis.

4. A robot arm mechanism as set forth in claim 3, in which said angle keeping mechanism is operative to keep substantially fixed said preset angle defined between said central line of said second arm link of said second robot arm and said central line of said second arm link of said first robot arm under the state that said first and second driving shafts are respectively pivoted clockwise and counterclockwise around said pivotal axis to have one of said first arm links of said first and second robot arms angularly moved with respect to the other of said first arm links of said first and second robot arms.

5. A robot arm mechanism as set forth in claim 2, in which said first intermediate link is inclined with respect to said first arm link of said first robot arm at a first inclination angle defined between said central line of said first intermediate link and said central line of said first arm link of said first robot arm; said second intermediate link is inclined with respect to said first arm link of said second robot arm at a second inclination angle defined between said central line of said second intermediate link and said central line of said second arm link of said second robot arm; and said first inclination angle defined between said central line of said first intermediate link to said central line of said first arm link of said first robot arm is substantially equal to said second inclination angle defined between said central line of said second intermediate link and said central line of said first arm link of said second robot arm under the state that said central lines of said first arm links of said first and second robot arms are axially aligned with each other.

6. A robot arm mechanism as set forth in claim 2, in which said first intermediate link is substantially equal in length to said second intermediate link.

7. A robot arm mechanism as set forth in claim 1, in which said angle keeping mechanism includes a pair of parallel links each having a first end portion, a second end portion and a central line passing through said first end portion and said second end portion, one of said parallel links being substantially equal in length to the other of said parallel links, a first intermediate link intervening between said second arm link of said first robot arm and one of said parallel links, said first intermediate link having a first end portion, a second end portion and a central line passing through said first end portion and said second end portion, said first end portion of said first intermediate link being pivotably connected to said second end portion of said first arm link of said first robot arm, and said first intermediate link being integrally formed with said second arm link of said first robot arm under the state that said first end portion of said first intermediate link is connected to said first end portion of said second arm link of said first robot arm, a second intermediate link intervening between said second arm link of said first robot arm and the other of said parallel links, said second intermediate link having a first end portion, a second end portion and a central line passing through said first end portion and said second end portion, said first end portion of said second intermediate link being pivotably connected to said second end portion of said first arm link of said first robot arm, and said second intermediate link being integrally formed with said second arm link of said first robot arm under the state that said first end portion of said second intermediate link is connected to said first end portion of said second arm link of said first robot arm, a third intermediate link intervening between said second arm link of said second robot arm and one of said parallel links, said third intermediate link having a first end portion, a second end portion and a central line passing through said first end portion and said second end portion, said third intermediate link being substantially equal in length to said second intermediate link, said first end portion of said third intermediate link being pivotably connected to said second end portion of said first arm link of said second robot arm, and said third intermediate link being integrally formed with said second arm link of said second robot arm under the state that said first end portion of said third intermediate link is connected to said first end portion of said second arm link of said second robot arm, and a fourth intermediate link intervening between said second arm link of said second robot arm and the other of said parallel links, said fourth intermediate link having a first end portion, a second end portion and a central line passing through said first end portion and said second end portion;

said fourth intermediate link is substantially equal in length to said second intermediate link, said fourth intermediate link being substantially longer in length than said third intermediate link, said first end portion of said fourth intermediate link being pivotably connected to said second end portion of said first arm link of said second robot arm, and said fourth intermediate link being integrally formed with said second arm link of said second robot arm under the state that said first end portion of said second intermediate link is connected to said first end portion of said second arm link of said second robot arm.

8. A robot arm mechanism, comprising:

a first handling member for supporting and handling a first object;

a second handling member for supporting and handling a second object;

a first robot arm including a first arm link having a first end portion, a second end portion and a central line passing through said first end portion and said second end portion, a pair of short parallel links each having a first end portion, a second end portion and a central line passing through said first end portion and said second end portion, one of said short parallel links being substantially equal in length to the other of said short parallel links, and a pair of long parallel links each having a first end portion, a second end portion and a central line passing through said first end portion and said second end portion, one of said long parallel links being substantially equal in length to the other of said long parallel links, said long parallel links being respectively inclined with respect to said first arm link at a first angle defined between said central line of each of said long parallel links and said first arm link, said second end portion of said first arm link being pivotably connected to said first end portion of one of said long parallel links, said second end portion of one of said long parallel links being pivotably connected to said first end portion of one of said short parallel links, said second end portion of one of said short parallel links being pivotably connected to said first end portion of the other of said long parallel links, said second end portion of the other of said long parallel links being pivotably connected to said first end portion of the other of said short parallel links, said second end portion of the other of said short parallel links being pivotably connected to said first end portion of one of said long parallel links, said second end portion of the other of said short parallel links being pivotably connected to said second end portion of said first arm link, and one of said short parallel links being connected to said first handling member to allow said first handling member to support said first object in a stable condition;

a second robot arm including a first arm link having a first end portion, a second end portion and a central line passing through said first end portion and said second end portion, a pair of short parallel links each having a first end portion, a second end portion and a central line passing through said first end portion and said second end portion, one of said short parallel links being substantially equal in length to the other of said short parallel links, said short parallel links being respectively inclined with respect to said short parallel links of said first robot arm at a preset angle defined between said central line of each of said short parallel links of said first robot arm and said central line of each of said short parallel links of said second robot arm, and a pair of long parallel links each having a first end portion, a second end portion and a central line passing through said first end portion and said second end portion, one of said long parallel links being substantially equal in length to the other of said long parallel links, said long parallel links being respectively inclined with respect to said first arm link at a second angle defined between said central line of each of said long parallel links and said first arm link, said second end portion of said first arm link being pivotably connected to said first end portion of one of said long parallel links, said second end portion of one of said long parallel links being pivotably connected to said first end portion of one of said short parallel links, said second end portion of one of said short parallel links being pivotably connected to said first end portion of the other of said long parallel links, said second end portion of the other of said long parallel links being pivotably connected to said first end portion of the other of said short parallel links, said second end portion of the other of said short parallel links being pivotably connected to one of said long parallel links, said second end portion of the other of said short parallel links being pivotably connected to said second end portion of said first arm link, and one of said short parallel links being connected to said second handling member to allow said second handling member to support said first object in a stable condition;

a robot arm moving mechanism connected to said first arm links of said first and second robot arms for allowing one of said first arm links of said first and second robot arms to be angularly moved with respect to the other of said first arm links of said first and second robot arms; and an angle keeping mechanism connected to said two pairs of long parallel links of said first and second robot arms for keeping substantially fixed said preset angle defined between said central line of each of said short parallel links of said second robot arm and said central line of each of said short parallel links of said first robot arm as one of said first arm links of said first and second robot arms is angularly moved with respect to the other of said first arm links of said first and second robot arms.

9. A robot arm mechanism as set forth in claim 8, in which said angle keeping mechanism includes a pair of first parallel links each having a first end portion, a second end portion, a longitudinally intermediate portion intervening between said first end portion and said second end portion and a central line passing through said first end portion and said second end portion, one of said first parallel links being substantially equal in length to the other of said first parallel links, a pair of second parallel links each having a first end portion, a second end portion and a central line passing through said first end portion and said second end portion, one of said second parallel links being substantially equal in length to the other of said second parallel links, said first end portion of one of said first parallel links being pivotably connected to said first end portion of one of said second parallel links, said second end portion of one of said second parallel links being pivotably connected to said second end portion of the other of said first parallel links, said second end portion of the other of said second parallel links being pivotably connected to said first end portion of the other of said first parallel links, and said first end portion of the other of said second parallel links being pivotably connected to said second end portion of one of said first parallel links, a first intermediate link intervening between said the other of said short arm links of said one of said robot arms and one of said second parallel links of said angle keeping mechanism, said first intermediate link having a first end portion, a second end portion and a central line passing through said first end portion and said second end portion, said first end portion of said first intermediate link being pivotably connected to said second end portion of said first arm link of said first robot arm, said first intermediate link being integrally formed with one of said short parallel links of said first robot arm, and said first intermediate link being integrally formed with one of said first parallel links of said angle keeping mechanism under the state that said second end portion of said first intermediate link is connected to said longitudinally intermediate portion of one of said first parallel links of said angle keeping mechanism, and a second intermediate link intervening between the other of said short parallel links of the other of said robot arms and the other of said first parallel links of said angle keeping mechanism, said second intermediate link having a first end portion, a second end portion and a central line passing through said first end portion and said second end portion, said first end portion of said second intermediate link being pivotably connected to said second end portion of said first arm link of said second robot arm, said second intermediate link being integrally formed with one of said short parallel links of said second robot arm, said second intermediate link being integrally formed with the other of said first parallel links of said angle keeping mechanism under the state that said second end portion of said second intermediate link is connected to said longitudinally intermediate portion of the other of said first parallel links of said angle keeping mechanism.

10. A robot arm mechanism as set forth in claim 8, in which said robot arm moving mechanism includes a first driving shaft connected to one of said first arm links of said first and second robot arms, and a second driving shaft connected to the other of said first arm links of said first and second robot arms, said second driving shaft having a pivotal axis and pivotable around said pivotal axis, and said first driving shaft being made in the form of a hollow shape to pivotably receive therein said second driving shaft and pivotable around said pivotal axis.

11. A robot arm mechanism as set forth in claim 10, in which said angle keeping mechanism is operative to keep substantially fixed said preset angle defined between said central line of each of said short parallel links of said second robot arm and said central line of each of said short parallel links of said first robot arm under the state that said first and second driving shafts are respectively pivoted clockwise and counterclockwise around said pivotal axis to have one of said first arm links of said first and second robot arms angularly moved with respect to the other of said first arm links of said first and second robot arms.

12. A robot arm mechanism as set forth in claim 9, in which said first intermediate link is inclined with respect to said first arm link of said first robot arm at a first inclination angle defined between said central line of said first intermediate link and said central line of said first arm link of said first robot arm; said second intermediate link is inclined with respect to said first arm link of said second robot arm at a second inclination angle defined between said central line of said second intermediate link and said central line of said first arm link of said second robot arm; and said first inclination angle defined between said central line of said first intermediate link to said central line of said first arm link of said first robot arm is substantially equal to said second inclination angle defined between said central line of said second intermediate link and said central line of said first arm link of said second robot arm under the state that said central lines of said first arm links of said first and second robot arms are axially aligned with each other.

13. A robot arm mechanism as set forth in claim 9, in which said first intermediate link is substantially equal in length to said second intermediate link.

14. A robot arm mechanism as set forth in claim 8, in which said angle keeping mechanism includes a first intermediate link having a first end portion, a second end portion and a central line passing through said first end portion and said second end portion, said first end portion of said first intermediate link being pivotably connected to said second end portion of said first arm link of said first robot arm, and said first intermediate link being integrally formed with the other of said short parallel links of said first robot arm, a second intermediate link having a first end portion, a second end portion and a central line passing through said first end portion and said second end portion, said first end portion of said second intermediate link being pivotably connected to said second end portion of said first arm links of said second robot arm, and said second intermediate link being integrally formed with the other of said short parallel links of said second robot arm, a third intermediate link intervening between said first intermediate link and said second intermediate link, said third intermediate link having a first end portion and a second end portion, a first pivotal shaft having a first end portion, a second end portion and a central line passing through said first end portion and said second end portion, a first pulley formed with a through bore and having received therein said first pivotal shaft, said first pulley being integrally formed with said first pivotal shaft, said first end portion of said first pivotal shaft being pivotally connected to the second end portion of said third intermediate link, and said first pivotal shaft being integrally formed with said first intermediate link under the state that said second end portion of said first pivotal shaft is connected to the second end portion of said first intermediate link, a second pivotal shaft having a first end portion, a second end portion and a central line passing through said first end portion and said second end portion, a second pulley formed with a through bore and having received therein said second pivotal shaft, said second pulley being integrally formed with said second pivotal shaft, said first end portion of said second pivotal shaft being pivotally connected to the second end portion of said third intermediate link, and said second pivotal shaft being integrally formed with said second intermediate link under the state that said second end portion of said second pivotal shaft is connected to the second end portion of said second intermediate link, and a driving belt stretched on said first pulley and said second pulley to transmit the driving force between said first pulley and said second pulley.

15. A robot arm mechanism as set forth in claim 14, in which said angle keeping mechanism is operative to keep substantially fixed said preset angle defined between said central line of each of said short parallel links of said second robot arm and said central line of each of said short parallel links of said first robot arm under the state that one of said first arm links of said first and second robot arms is angularly moved with respect to the other of said first arm links of said first and second robot arms.

16. A robot arm mechanism as set forth in claim 15, in which said first intermediate link is inclined with respect to said first arm link of said first robot arm at a first inclination angle defined between said central line of said first intermediate link and said central line of said first arm link of said first robot arm; said second intermediate link is inclined with respect to said first arm link of said first robot arm at a second inclination angle defined between said central line of said second intermediate link and said central line of said first arm link of said second robot arm; and said first inclination angle is substantially equal to said second inclination angle under the state that said central lines of said first arm links of said first and second robot arms are axially aligned with each other.

17. A robot arm mechanism as set forth in claim 14, in which said first intermediate link is substantially equal in length to said second intermediate link.

18. A robot arm mechanism as set forth in claim 8, which further comprises
- a first angle adjusting mechanism for adjusting said first angle defined between said central line of each of said long parallel links and said first arm link in response to said first inclination angle defined between said central line of said first intermediate link and said central line of said first arm link of said first robot arm to have said first handling member move substantially straight along a predetermined first straight line under the state that one of said first arm links of said first and second robot arms is angularly moved with respect to the other of said first arm links of said first and second robot arms; and
- a second angle adjusting mechanism for adjusting said second angle defined between said central line of each of said long parallel links and said first arm link in response to said second inclination angle defined between said central line of said second intermediate link and said central line of said first arm link of said second robot arm to have said second handling member move substantially straight along a predetermined second straight line under the state that one of said first arm links of said first and second robot arms is angularly moved with respect to the other of said first arm links of said first and second robot arms.

19. A robot arm mechanism as set forth in claim 18, in which said first angle adjusting mechanism includes
- a first link having a first end portion and a second end portion,
- a second link having a first end portion and a second end portion,
- a third link having a first end portion and a second end portion,
- a fourth link having a first end portion and a second end portion,
- a fifth link having a first end portion, a second end portion and a longitudinally intermediate portion intervening between said first end portion and said second end portion, and
- a sixth link having a first end portion and a second end portion, said first link being substantially equal in length to said fourth link, said second link being substantially equal in length to said fifth link, and said sixth link being substantially equal in length to said first link;

said first link is integrally formed with one of said short parallel links of said first robot arm under the state that said first end portion of said first link is connected to said first end portion of one of said short parallel links of said first robot arm;

said second link is integrally formed with said first arm link of said first robot arm under the state that said first end portion of said second link is connected to said first end portion of said first arm link of said first robot arm;

said third link is integrally formed with one of said long parallel links of said first robot arm under the state that said first end portion of said third link is connected to said first end portion of one of said long parallel links of said first robot arm;

said first end portion of said fourth link is pivotably connected to said second end portion of said second link;

said first end portion of said fifth link is pivotably connected to said second end portion of said second link, said second end portion of said fifth link being pivotably connected to said second end portion of said fourth link;

said first end portion of said sixth link is pivotably connected to said second end portion of said third link, said second end portion of said sixth link being pivotably connected to said longitudinally intermediate portion of said fifth link;

said second angle adjusting mechanism includes
- a first link having a first end portion and a second end portion,
- a second link having a first end portion and a second end portion,
- a third link having a first end portion and a second end portion,
- a fourth link having a first end portion and a second end portion,
- a fifth link having a first end portion, a second end portion and a longitudinally intermediate portion intervening between said first end portion and said second end portion, and
- a sixth link having a first end portion and a second end portion, said first link being substantially equal in length to said fourth link, said second link being substantially equal in length to said fifth link, and said sixth link being substantially equal in length to said first link;

said first link is integrally formed with one of said short parallel links of said second robot arm under the state that said second end portion of said first link is connected to said first end portion of one of said short parallel links of said second robot arm;

said second link is integrally formed with said first arm link of said second robot arm under the state that said first end portion of said second link is connected to said first end portion of said first arm link of said second robot arm;

said third link is integrally formed with one of said long parallel links of said second robot arm under the state that said first end portion of said third link is connected to said first end portion of one of said long parallel links of said second robot arm;

said first end portion of said fourth link is pivotably connected to said second end portion of said second link;

said first end portion of said fifth link is pivotably connected to said second end portion of said first link, said second end portion of said fifth link being pivotably connected to said second end portion of said fourth link; and said first end portion of said sixth link is pivotably connected to said second end portion of said third link, said second end portion of said sixth link being pivotably connected to said longitudinally intermediate portion of said fifth link.

20. A robot arm mechanism as set forth in claim 18, in which said first angle adjusting mechanism includes
- a first gear shaft having a first end portion and a second end portion,
- a first gear formed with a through bore and received therein said first gear shaft, said first gear being integrally formed with said first gear shaft, said first end portion of said first gear shaft being integrally formed with said first end portion of said first arm link of said first robot arm,
- a second gear shaft having a first end portion and a second end portion, and
- a second gear formed with a through bore and received therein said second gear shaft, said second gear being integrally formed with said second gear shaft, said first end portion of said second gear shaft being integrally formed with said second end portion of one of said long parallel links of said first robot arm, and said second end portion of said second gear shaft being pivotally connected to one of said short parallel links of said first robot arm;

said second angle adjusting mechanism includes
- a first gear shaft having a first end portion and a second end portion,
- a first gear formed with a through bore and received therein said first gear shaft, said first gear being integrally formed with said first gear shaft, said first end portion of said first gear shaft being integrally formed with said first end portion of said first arm link of said second robot arm,
- a second gear shaft having a first end portion and a second end portion, and
- a second gear formed with a through bore and received therein said second gear shaft, said second gear being integrally formed with said second gear shaft, said first end portion of said second gear shaft being integrally formed with said second end portion of one of said long parallel links of said second robot arm, and said second end portion of said second gear shaft being pivotally connected to one of said short parallel links of said second robot arm.

21. A robot apparatus, comprising:
a robot arm mechanism, including:
a first handling member for supporting and handling a first object;
a second handling member for supporting and handling a second object;
a first robot arm including a first arm link having a first end portion, a second end portion, and a central line passing through said first end portion and said second end portion, and a second arm link having a first end portion, a second end portion, and a central line passing through said first end portion and said second end portion, said first end portion of said second arm link being pivotably connected to said second end portion of said first arm link, and said second end portion of said second arm link being connected to said first handling member to allow said first handling member to support said first object in a stable condition;
a second robot arm including a first arm link having a first end portion, a second end portion, and a central line passing through said first end portion and said second end portion, and a second arm link having a first end portion, a second end portion, and a central line passing through said first end portion and said second end portion, said first end portion of said second arm link being pivotably connected to said second end portion of said first arm link, said second arm link having a preset angle defined between said central line of said second arm link of said second robot arm and said central line of said second arm link of said first robot arm, and said second end portion of said second arm link being connected to said second handling member to allow said second handling member to support said second object in a stable condition;
a robot arm moving mechanism connected to said first arm links of said first and second robot arms for allowing one of said first arm links of said first and second robot arms to be angularly moved respect to the other of said first arm links of said first and second robot arms; and
an angle keeping mechanism connected to said second arm links of said first and second robot arms for keeping substantially fixed said preset angle defined between said central line of said second arm link of said second robot arm and said central line of said second arm link of said first robot arm as one of said first arm links of said first and second robot arms is angularly moved with respect to the other of said first arm links of said first and second robot arms;
a first driving motor for driving one of said first arm links of said first robot arm and said second robot arm; and
a second driving motor for driving the other of said first arm links of said first robot arm and said second robot arm.

* * * * *